(12) United States Patent
Lowrey et al.

(10) Patent No.: US 6,314,014 B1
(45) Date of Patent: Nov. 6, 2001

(54) PROGRAMMABLE RESISTANCE MEMORY ARRAYS WITH REFERENCE CELLS

(75) Inventors: Tyler Lowrey, Sandpoint, ID (US); Guy C. Wicker, Southfield, MI (US)

(73) Assignee: Ovonyx, Inc., Troy, MI (US)

( * ) Notice: Subject to any disclaimer, the term of this patent is extended or adjusted under 35 U.S.C. 154(b) by 0 days.

(21) Appl. No.: 09/464,898

(22) Filed: Dec. 16, 1999

(51) Int. Cl.⁷ .................................................. G11C 17/00
(52) U.S. Cl. ...................... 365/100; 365/189.07; 365/210
(58) Field of Search ..................... 365/100, 210, 365/226, 189.07, 163, 207

(56) References Cited

U.S. PATENT DOCUMENTS

| | | |
|---|---|---|
| 4,272,833 | 6/1981 | Taylor . |
| 4,720,758 * | 1/1988 | Winslow ................................. 361/93 |
| 5,166,758 | 11/1992 | Ovshinsky . |
| 5,296,716 | 3/1994 | Ovshinsky . |
| 5,341,328 | 8/1994 | Ovshinsky . |
| 5,359,205 | 10/1994 | Ovshinsky . |
| 5,414,271 | 5/1995 | Ovshinsky . |
| 5,534,712 | 7/1996 | Ovshinsky . |
| 5,536,947 | 7/1996 | Klersy . |
| 5,687,112 | 11/1997 | Ovshinsky . |
| 5,737,260 * | 4/1998 | Takata et al. ........................ 365/145 |
| 5,787,042 * | 7/1998 | Morgan ................................. 365/196 |
| 5,825,046 | 10/1998 | Czubatyj . |
| 5,883,827 * | 3/1999 | Morgan ................................. 365/100 |
| 5,936,880 * | 8/1999 | Payne .................................... 365/148 |
| 6,080,592 * | 6/2000 | Paz De Araujo et al. .............. 438/3 |
| 6,084,795 * | 7/2000 | Nunokawa ............................ 365/145 |

* cited by examiner

*Primary Examiner*—David Nelms
*Assistant Examiner*—Hoai V. Ho
(74) *Attorney, Agent, or Firm*—Philip H. Schlazer; Marvin S. Siskind; David W. Schumaker

(57) ABSTRACT

A memory system comprising memory cells and reference cells each including a programmable resistance element. The resistance state of a memory cell is determined by comparing a sense signal developed by the memory cell with a reference signal developed by one or more of the reference cells. The programmable resistance elements may comprise a phase-change material.

99 Claims, 9 Drawing Sheets

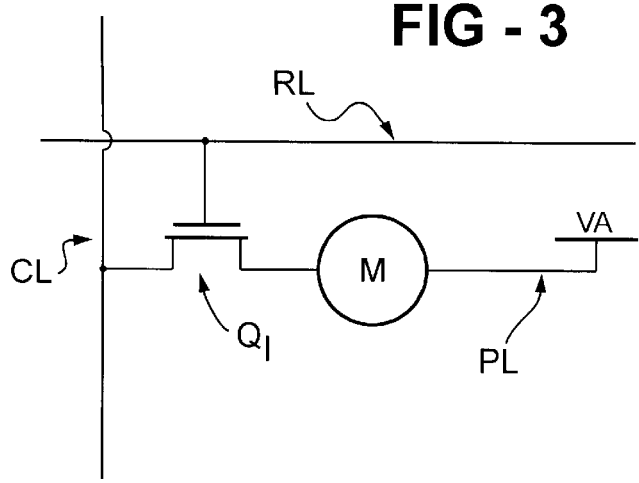
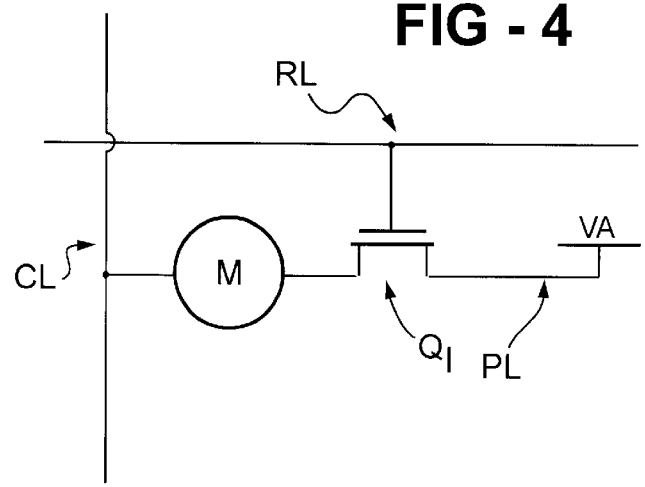
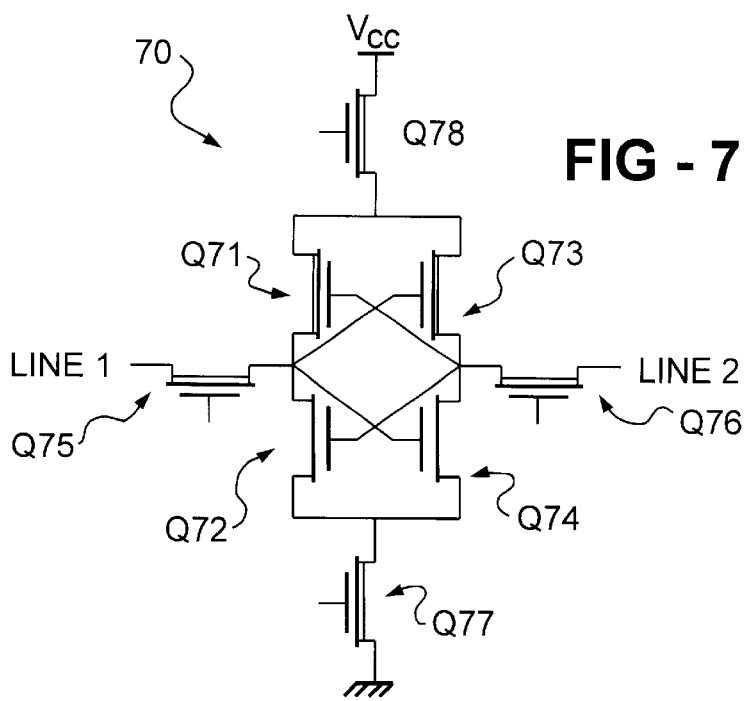

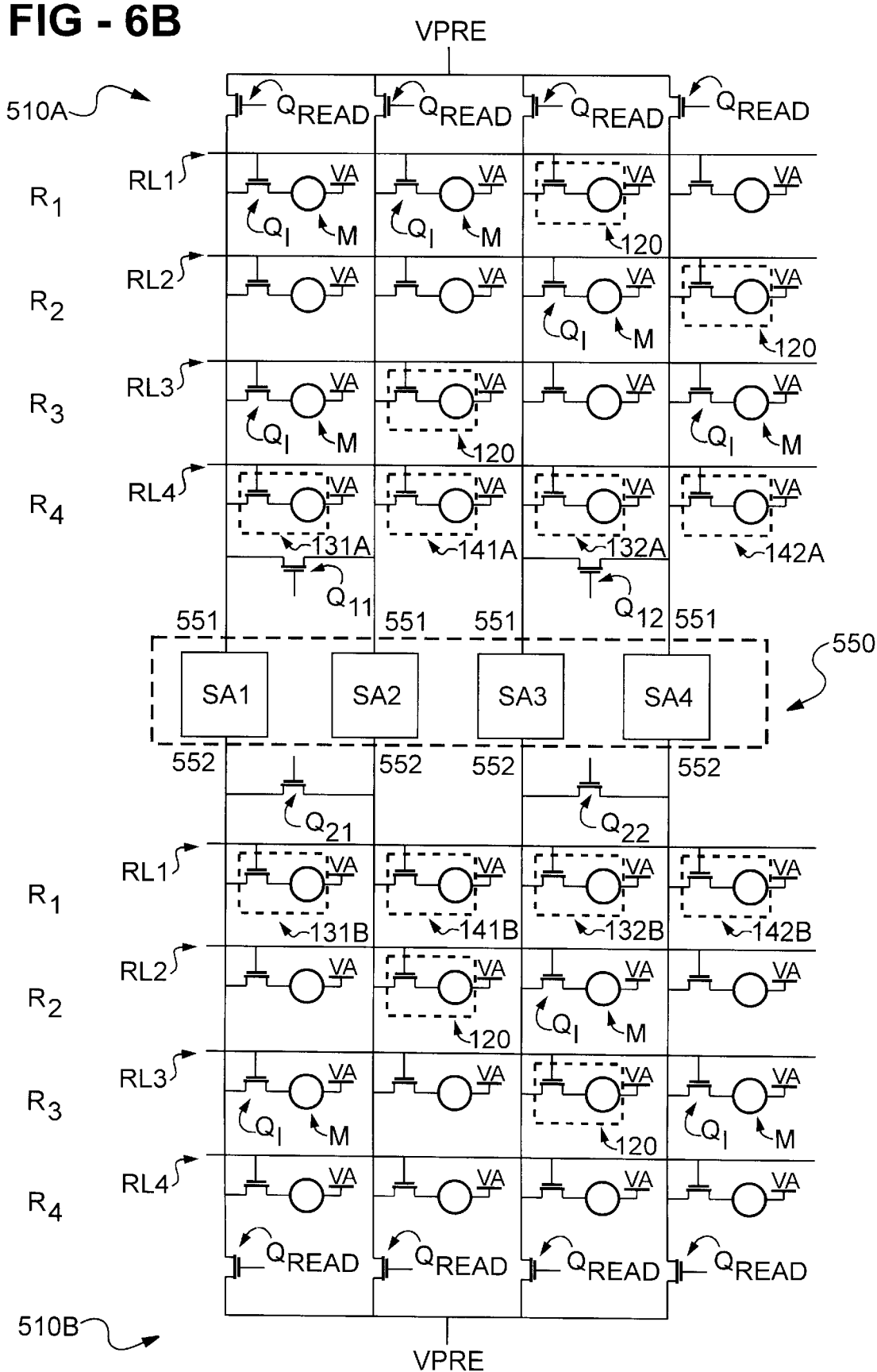

PROGRAMMABLE RESISTANCE MEMORY ARRAYS WITH REFERENCE CELLS

FIELD OF THE INVENTION

The present invention relates generally to electrically programmable memory arrays. More specifically, the present invention relates to circuitry for reading data from an array of programmable resistance elements.

BACKGROUND OF THE INVENTION

Programmable resistance memory elements formed from materials that can be programmed to exhibit at least a high or low stable ohmic state are known in the art. Such programmable resistance elements may be programmed to a high resistance state to store, for example, a logic ONE data bit or programmed to a low resistance state to store a logic ZERO data bit.

One type of material that can be used as the memory material for programmable resistance elements is phase-change material. Phase-change materials may be programmed between a first structural state where the material is generally more amorphous (less ordered) and a second structural state where the material is generally more crystalline (more ordered). The term "amorphous", as used herein, refers to a condition which is relatively structurally less ordered or more disordered than a single crystal and has a detectable characteristic, such as high electrical resistivity. The term "crystalline", as used herein, refers to a condition which is relatively structurally more ordered than amorphous and has lower electrical resistivity than the amorphous state.

The phase-change materials may be programmed between different detectable states of local order across the entire spectrum between completely amorphous and completely crystalline states. That is, the programming of such materials is not required to take place between completely amorphous and completely crystalline states but rather the material can be programmed in incremental steps reflecting (1) changes of local order, or (2) changes in volume of two or more materials having different local order so as to provide a "gray scale" represented by a multiplicity of conditions of local order spanning the spectrum between the completely amorphous and the completely crystalline states. For example, phase-change materials may be programmed between different resistive states while in crystalline form.

A volume of phase-change material may be programmed between a more ordered, low resistance state and a less ordered, high resistance state. A volume of phase-change is capable of being transformed from a high resistance state to a low resistance state in response to the input of a single pulse of energy referred to as a "set pulse". The set pulse is sufficient to transform the volume of memory material from the high resistance state to the low resistance state. It is believed that application of a set pulse to the volume of memory material changes the local order of at least a portion of the volume of memory material. Specifically, it is believed that the set pulse is sufficient to change at least a portion of the volume of memory material from a less-ordered amorphous state to a more-ordered crystalline state.

The volume of memory material is also capable of being transformed from the low resistance state to the high resistance state in response to the input of a single pulse of energy which is referred to as a "reset pulse". The reset pulse is sufficient to transform the volume of memory material from the low resistance state to the high resistance state. While not wishing to be bound by theory, it is believed that application of a reset pulse to the volume of memory material changes the local order of at least a portion of the volume of memory material. Specifically, it is believed that the reset pulse is sufficient to change at least a portion of the volume of memory material from a more-ordered crystalline state to a less-ordered amorphous state.

The use of phase-change materials for electronic memory applications is known in the art. Phase-change materials and electrically programmable memory elements formed from such materials are disclosed, for example, in U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein. Still another example of a phase-change memory element is provided in U.S. patent application Ser. No. 09/276,273, the disclosure of which is also incorporated herein by reference.

It is important to be able to accurately read the resistance states of programmable resistance elements which are arranged in a memory array. The present invention describes an apparatus and method for accurately determining the resistance states of programmable resistance elements arranged as memory cells in a memory array. Background art circuitry is provided in U.S. Pat. No. 4,272,833 which describes a reading apparatus based upon the variation in the threshold levels of memory elements, and U.S. Pat. No. 5,883,827 which describes an apparatus using a fixed resistance element to generate reference signals. Both U.S. Pat. No. 4,272,833 and U.S. Pat. No. 5,883,827 are incorporated by reference herein.

SUMMARY OF THE INVENTION

An object of the present invention is to provide circuitry for accurately reading the resistance state of programmable resistance elements. Another objects of the present invention is to provides methods for accurately reading the resistance states of programmable resistance elements.

These and other objects are satisfied by a memory system, comprising:
one or more memory cells, each of the memory cells including a programmable resistance element programmable to at least a first resistance state and a second resistance state;
one or more reference cells, each of said reference cells including a programmable resistance element programmable to at least the first resistance state and the second resistance state; and
a comparison circuit in electrical communication with the memory cells and with the reference cells, the comparison circuit adapted to compare at least one sense signal developed by at least one of the memory cells with at least one reference signal developed by at least one of the reference cells and to provide at least one output signal in response to the comparisons.

These and other objects are satisfied by a memory system, comprising:
one or more memory cells, each of the memory cells including a programmable resistance element programmable to at least a first resistance state and a second resistance state;
one or more reference cells, each of the reference cells including a programmable resistance element programmable to at least the first resistance state and the second resistance state; and
a comparison circuit in electrical communication with the is memory cells and with the reference cells, the comparison circuit adapted to compare a sense signal developed by one of the memory cells with a reference signal developed by at least one of the reference cells and to provide an output signal in response to the comparison.

These and other objects are satisfied by a memory system, comprising:

at least a first and a second memory array, each of the arrays comprising:
one or more memory cells, each of the memory cells including a programmable resistance element programmable to at least a first resistance state and a second resistance state;
one or more reference cells, each of the reference cells including a programmable resistance element programmable to at least the first resistance state and the second resistance state; and
a comparison circuit in electrical communication with the first and second arrays, the comparison circuit adapted to compare at least one sense signal developed by at least one of the memory cells of the first array with at least one reference signal developed by at least one of the reference cells of the second array, the comparison circuit adapted to compare at least one sense signal developed by at least one of the memory cells of the second array with at least one reference signal developed by at least one of the reference cells of the first array, the comparison circuit adapted to provide at least one output signal in response to the is comparisons.

These and other objects are satisfied by a memory system, comprising:

at least a first programmable resistance element programmable to at least a first resistance state and a second resistance state;
at least a second programmable resistance element programmable to at least the first resistance state-and the second resistance state, the second element programmed to the first resistance state;
at least a third programmable resistance element programmable resistance element programmable to at least the first resistance state and the second resistance state, the third element programmed to the second resistance state; and
a comparison circuit in electrical communication with each of the resistance elements, the comparison circuit adapted to compare a sense signal developed by the first element with at least one reference signal developed by at least the second element and/or the third element, and to provide at least one output signal in response to the comparisons.

These and other objects are satisfied by a memory system, comprising:

a memory cell comprising a programmable resistance element programmable to at least a first resistance state and a second resistance state, the memory cell interconnecting a row line and a column line; and
a power line, distinct from the row line and the column line, coupling the memory cell to a power source.

These and other objectives of the invention are satisfied by a method of reading a memory cell, the memory cell including a programmable resistance element programmable to at least a first resistance state and a second resistance state, the method comprising the steps of:

providing one or more reference cells, each of the reference cells including a programmable resistance element programmable to at least the first resistance state and the second resistance state;

developing a sense signal by directing a current through the memory cell;

developing at least one reference signal by directing at least one current through at least one of the reference cells;

comparing the sense signal with the at least one reference signal; and providing an output signal in response to the comparing step.

These and other objects are satisfied by a method of reading a memory cell, the memory cell comprising a programmable resistance element programmable to at least a first resistance state and a second resistance state, the memory cell interconnecting a row line and a column line, the method comprising the steps of:

directing the column line to a first voltage level;

directing the row line to a second voltage level sufficient to cause a current to flow through the programmable resistance element, the current directing the column line to a third voltage level; and comparing the third voltage level to a reference voltage.

These and other objects are satisfied by a method of operating a memory cell, the memory cell interconnecting a column line and a row line, the memory cell including a programmable resistance element programmable to at least a first resistance state and a second resistance state, the programmable element having at least a first and second terminal, the first terminal coupled or selectively coupled to the column or the row line, the second terminal coupled or selectively coupled to a third line distinct from the column and row lines, the method comprising the steps of:

reading data from the programmable element, the reading step comprising the step of developing a first potential difference across the programmable element; and writing data to the programmable element, the writing step comprising the step of developing a second potential difference across the programmable element.

BRIEF DESCRIPTION OF THE DRAWINGS

FIG. 3 is a schematic diagram showing a first configuration of a memory cell or reference cell;

FIG. 4 is a schematic diagram showing a second configuration of a memory cell or reference cell;

FIG. 6B is a schematic diagram of a second embodiment of the present invention showing how a precharge voltage may coupled to the column lines;

FIG. 7 is a schematic diagram of a sense amplifier that may be used as part of the comparison circuit of the present invention.

DETAILED DESCRIPTION OF THE INVENTION

Figure 1:
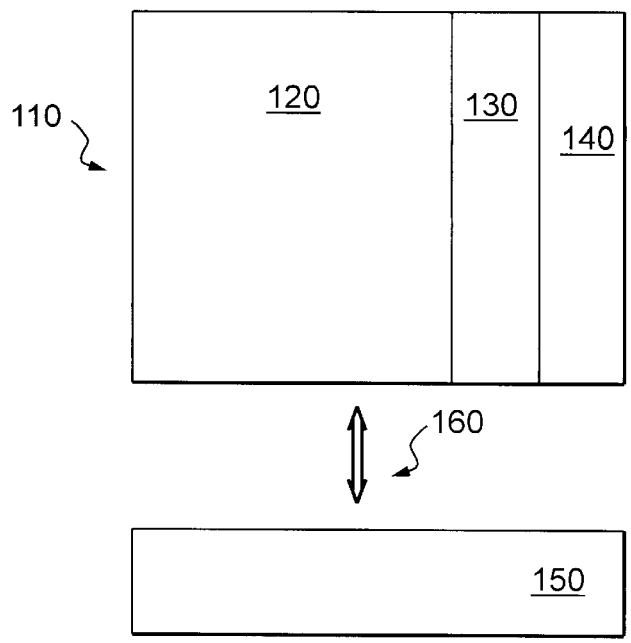
FIG. 1 is a block diagram of a first embodiment of the present invention showing an comparison circuit in electrical communication with a memory array.

The present invention relates to circuitry to reliably read the resistance states of one or more programmable resistance elements. Each of the programmable resistance elements is programmable to at least a first resistance state and a second resistance state. The programmable resistance elements are preferably arranged in one or more memory arrays.

As used herein, the terminology "resistance" refers to electrical resistance; the terminology "programmable resistance element", "memory element", "memory device", and "device" are synonymous and may be used interchangeably; "coupling" refers to "electrical coupling"; the terminology "at least one" is identical with "one or more" and these terms may be used interchangeably.

The first resistance state may correspond to a "low" resistance state and the second resistance state may correspond to a "high" resistance state. The high resistance state has an electrical resistance value which is greater than the electrical resistance value of the low resistance state. The memory elements may be programmed by selectively applying energy pulses (and preferably, electrical energy pulses) having the appropriate amplitudes, pulse widths, rise times and falls times.

The memory system of the present invention comprises one or more memory cells operable to provide memory storage. Preferably, the memory system comprises a plurality of memory cells. The memory system further comprises one or more reference cells operable to develop at least one reference signal for determining the resistance states of the memory cells. Preferably, the memory system comprises a plurality of reference cells. Each of the memory cells and each of the reference cells includes a programmable resistance element which, as described above, is programmable to at least a first resistance state and a second resistance state. Each of the memory cells and each of the reference cells may further include an isolation element used to electrically isolate each programmable resistance element from all other programmable resistance elements so that a specific memory element may be written to or read from without affecting any other memory element. Examples of isolation elements include diodes, bipolar transistors, as well as field effect transistors such as MOS field effect transistors. The MOS field effect transistors may use PMOS, NMOS, or CMOS technology. Preferably, the MOS transistors are switching devices which have a control terminal (i.e., the gate) which controls the current flow within the switch. Other types of switching devices may be used.

The reference cells preferably include one or more "first reference cells", and one or more "second reference cells". A "first reference cell" is a reference cell wherein the corresponding programmable resistance element is programmed to the first resistance state. A "second reference cell" is a reference cell wherein the corresponding programmable resistance element is programmed to the second resistance state. As used herein, language describing the resistance state of a memory cell or a reference cell is referring to the resistance state of the corresponding programmable resistance element. (Hence, when it is stated that a memory cell or reference cell is programmed to the first or second resistance state, this means that the corresponding programmable resistance element is programmed to the first or second resistance state). Preferably, the memory system comprises a plurality of first reference cells and a plurality of second reference cells.

The memory system of the present invention includes a comparison circuit. Generally, the comparison circuit is in electrical communication with the memory cells and the reference cells. Furthermore, the comparison circuit is adapted to compare at least one sense signal developed by at least one of the memory cells with at least one reference signal developed by at least one of the reference cells. The comparison circuit is further adapted to provide at least one output signal in response to the comparisons. The comparison circuit may be further adapted to latch the sense signals and the reference signals.

Each of the sense signals may be developed by directing at least one current (referred to herein as a "sense current") through at least one of the memory cells). Furthermore, each of the reference signals may be developed by directing at least one current (referred to herein as a reference current) through at least one of the reference cells. Each of the sense signals may be a voltage (referred to herein as a "sense voltage"). Furthermore, each of the reference signals may a voltage (referred to herein as a "reference voltage").

In one embodiment of the present invention, each of the sense signals is developed by a single memory cell. Preferably, the sense signal is developed by a particular memory cell by directing a sense current through the memory cell. The comparison circuit is adapted to compare this sense signal to a reference signal developed by at least one of the reference cells. Preferably, the reference signal is developed by at least one of the first reference cells and at least one of the second reference cells. Most preferably, the reference signal -is developed by one of the first reference cells and one of the second reference cells. Preferably, the sense signal and the reference signal are both voltages. The comparison circuit compares the sense signal with the reference signal. As a result of this comparison, the comparison circuit provides an output signal which is preferably indicative of the resistance state of the memory cell (i.e., the resistance state of the corresponding programmable resistance element). Hence, the resistance state of the memory cell can be read.

While it is preferable that the reference signal is developed by at least one first reference cell and at least one second reference cell, other embodiments are also possible. For example, it is also possible that the reference signal is developed by at least one first reference cell (without the second reference cells). It is also possible that the reference signal is developed by at least one second reference cell (without the first reference cells). It is also possible that the reference signal is a "combination" of a first signal developed by at least one first reference cell and a second signal developed by at least one second reference cell. The idea of forming a reference signal by "combining" signals is described below.

In the embodiment of the invention just discussed, the comparison circuit is adapted to compare a sense signal developed by a memory cell to a single reference signal. In another embodiment of the present invention, the comparison circuit may be adapted to compare a sense signal developed by a memory cell to a plurality of reference signals. The reference signals may include a reference signal developed by at least one first reference cell. The reference signals may include a reference signal developed by at least one second reference cell. The reference signals may include a reference signal developed by at least one first reference cell and at least one second reference cell. The reference signals may include a reference signal which is a "combination" of a first signal developed by at least one first reference cells and a second signal developed by at least one second reference cell. In a possible implementation, a sense signal developed by a memory cell may be compared to a first reference signal developed by one or more of the first reference cells and to a second reference signal developed by one or more of the second reference cells. The comparison circuit may be specially adapted to make this multiple comparison. For example, the comparison circuit may use signal processing, pattern recognition, artificial intelligence, and rule-based techniques to compare multiple reference signals to a sense signal to determine the resistance state of a memory cell.

In the embodiment described above, the sense signal is developed by a single memory cell. In yet another embodiment of the invention, it is also possible that the sense signal is developed by a plurality of memory cells.

It is noted that the comparison circuit may be adapted so that a plurality of memory cells can be read at the same time. The plurality of memory cells may, for example, all be arranged in the same row of a memory array. Hence, a plurality of sense signals may be compared to a single reference signal which is developed by one or more of the reference cells. Alternately, a plurality of sense signals may be compared to a plurality of corresponding reference signals.

Hence, the comparison circuit of the present invention may be adapted to compare at least one sense signal developed by at least one of the memory cells to at least one reference signal developed by at least one of the reference cells. In certain embodiments of the present invention, the individual reference signals may be developed one or more of following: (a) a least one first reference cell, (b) at least one second reference cell, or (c) at least one first reference cell and at least one second reference cell.

The comparison circuit used on the memory system of the present invention may comprise one or more comparators. Preferably, each comparator has a first and a second input, and is adapted to compare a first input signal (preferably a voltage) received on the first input with a second input signal (preferably a voltage) and to provide an output signal based upon this comparison. An example of a comparator is a sense amplifier. One of the inputs of the sense amplifier may receive the sense signal while the other input may receive the reference signal. The comparison circuit may also be adapted to "latch" or store the sense signals and reference signals. As discussed above, it is conceivable that a comparison circuit may be developed which uses principles of signal processing, artificial intelligence, rule-based systems, pattern recognition, etc. to make the necessary comparisons.

The memory cells and the reference cells may be arranged in one or more memory arrays. In one embodiment of the present invention, the memory cells and the reference cells are arranged in the rows and columns of a single memory array. FIG. 1 shows a block diagram of a possible arrangement of memory cells and reference cells in a memory array 110. Preferably, the memory cells 120 are arranged in at least one column of the memory array 110. More preferably, the memory cells 120 are arranged as a plurality of columns of the memory array 110.

Preferably, the reference cells comprise a plurality of first reference cells 130 and a plurality of second reference cells 140. Preferably, the first reference cells 130 are arranged as at least one column of first reference cells. Preferably, the second reference cells 140 are arranged as at least one column of second reference cells. The memory cells 120, first reference cells 130 and second reference cells 140 are in electrical communication with a comparison circuit 150. The electrical communication is represented by the double arrow 160 in FIG. 1.

Figure 2A:
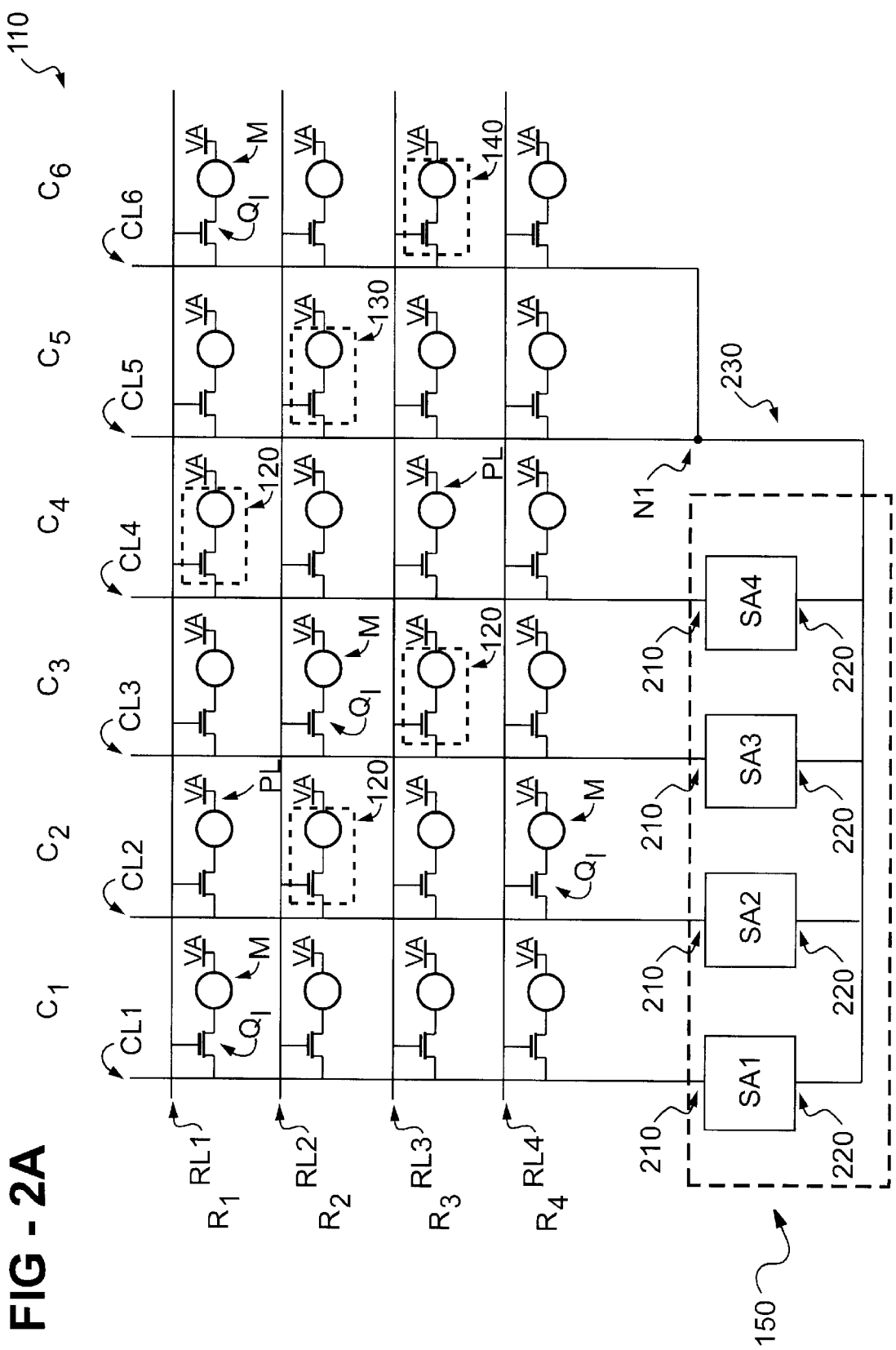
FIG. 2A is a schematic diagram of a first embodiment of the present invention.

FIG. 2A is a detailed example of the memory system of FIG. 1. FIG. 2A shows a memory array 110 having columns C1 . . . C6 and rows R1 . . . R4. The memory cells 120 are arranged in the four columns C1 . . . C4 and in the four rows R1 . . . R4. The first reference cells 130 are arranged in column C5 and rows R1 . . . R4 of array 110. The second reference cells 140 are arranged in column C6 and rows R1 . . . R4 of array 110. In the example shown, there is a unique first reference cell and a unique second reference cell per row of the memory array. It is noted that the size of the memory array (i.e., the number of rows and columns) is not limited to any particular number of rows or any particular number of columns. Also, the arrangement of the memory cells, first reference cells and second reference cells in the memory array is not limited to any specific columns in the memory array. It is noted that in other embodiments, the memory cells and reference cells may be arranged as rows so that there is one or more unique reference cell per column of the array.

Preferably, the memory array 110 further comprises a plurality of "row lines" and a plurality of "column lines". As used herein, the terminology "row line" is synonymous with the terminology "wordline". Each row line is associated with a corresponding row of the array. In the example of FIG. 2, each row line RL1 . . . RL4 is associated with a corresponding row R1 . . . R4. Furthermore, each row line RL1 . . . RL4 is coupled to the memory cells and/or reference cells which are in the corresponding row.

The memory array 110 further comprises a plurality of "column lines". As used herein the terminology "column line" is synonymous with the terminology "bitline". Each of the column lines is associated with a corresponding column of the memory array. In the example of FIG. 2, each column line CL1 . . . . CL6 is associated with a corresponding column C1 . . . C6 of the array. Furthermore, each column line CL1 . . . CL6 is coupled to the memory cells and/or reference cells which are in the corresponding column. In the example shown, column lines CL1 . . . CL4 are coupled to the memory cells in columns C1 . . . C4, respectively. Column lines CL5 and CL6 are coupled to reference cells in column C5 and C6, respectively.

In the example shown in FIG. 2A, each memory cell and each reference cell is coupled to a row line and to a column line. Furthermore, each memory cell and each reference cell is also coupled to a "power line" PL which is preferably distinct from either the row line or the column line. The power line couples the memory cell or reference cell to a power source which is preferably a voltage source VA. Preferably, VA is some fixed value. It is possible that VA could be zero. Also, other implementations are possible where the third power line PL is not used.

FIG. 3 shows a single memory cell (or reference cell) from FIG. 2A interconnecting a column line CL with a row line RL. As shown, the memory element M is directly coupled to the voltage source VA (through the power line PL) while the programmable resistance element M is selectively coupled to the column line CL through the current path of the isolation MOS transistor $Q_I$. More specifically, a first terminal of the transistor $Q_I$ (i.e., source or drain) may be coupled to the column line CL, a second terminal of the transistor $Q_I$ (source or drain) may be coupled to a first terminal of the memory element M, the control terminal of the transistor $Q_I$ (the gate) may be coupled to the row line RL, and a second terminal of the memory element M may coupled to the power line PL. The power line PL couples the memory element to the voltage source VA.

A second embodiment of a memory cell configuration which uses a power line PL is shown in FIG. 4. In this case, the memory element M is directly coupled to the column line CL while the power line PL (and the voltage source VA) is selectively coupled to the memory element through the current path of the isolation MOS transistor $Q_I$.

It is noted that it is conceivable that a configuration for the memory cell is possible where the programmable resistance elements are either coupled or selectively coupled to the row line rather than the column line.

As seen from either FIG. 3 or 4, switching transistor $Q_I$ on couples the voltage source VA to the column line through the memory element M. If the voltage on the column line is different from VA, there will be a potential difference across the memory element and current will flow through the memory element.

Preferably, when the memory element M is being read, the potential difference across the memory element M is set to a first potential difference which is less than the threshold voltage of the device. This is done to prevent the device from changing states during the read operation. With the potential below the threshold voltage a current may then be directed through the memory element to develop a sense signal. However, when the memory element is being written to, it is preferable that the potential difference across the memory element be set to a second potential difference which is greater than the threshold voltage of the device. This ensures that the device is switched on. Currents may then be directed through the memory element sufficient to write data to the memory element. For example, currents may be directed through the device which are sufficient to either set or reset the memory element.

Hence, a memory cell may be operated by developing a first potential difference across the corresponding programmable resistance element during a read operation and a second potential difference across the programmable resistance element during a write operation. Preferably, the first potential difference is less than the threshold voltage of the programmable resistance element. Preferably, the second potential difference is greater than the threshold voltage of the programmable resistance element. The potential difference across the programmable resistance element may be varied by varying the value of VA applied to the memory element via the power line PL (i.e., the third line which is distinct from either the column line or the row line). For example, a first value of VA may be used during a read operation which is sufficient to cause the first potential difference described above. Likewise, a second value of VA may be used during a write operation which is sufficient to create the second potential difference described above. It is noted that both the reading and writing steps both include the step of directing a current through the memory element.

As noted above, the memory system of the present invention further comprises a comparison circuit. Referring again to FIG. 2A, the comparison circuit 150 may be implemented by one or more comparators such as one or more sense amplifiers. In the example shown in FIG. 2A, the comparison circuit comprises a plurality of sense amplifiers SA1 . . . SA4 where each of the sense amplifiers SA1 . . . SA4 is associated with a corresponding column of memory cells C1 . . . C4.

Each of the column lines CL1 . . . CL4 is coupled to a first input 210 of a corresponding sense amplifier SA1 . . . SA4. The column lines CL5 and CL6 (associated with columns C5 and C6 of reference cells) are directly coupled together at node N1. (In an alternate embodiment, the column lines CL5 and CL6 may be selectively coupled together through a switching means such as through the current path of a MOS transistor). The reference node N1 is coupled to a second input 220 of each of the sense amplifiers SA1 . . . SA4. This may be done through a reference line 230.

The resistance state of the memory cells may be determined by the sense amplifiers by comparing sense signals developed by the memory cells to reference signal developed by the reference cells. To determine the resistance state of a memory cell 130, a sense signal developed by the memory cell is compared to a reference signal developed by the first and second reference cells 130, 140 which are in the same row as the memory cell. Preferably, the sense signal is a sense voltage developed by directing a current through the programmable resistance element of the memory cell. The sense voltage is related to the resistance of the programmable resistance element of the memory cell. Preferably, the reference signal is a reference voltage developed by directing currents through the programmable resistance elements of a first and a second reference cell, respectively. The reference voltage is related to the resistances of the programmable resistance elements of the first and second reference cells. The sense voltage appears on the column line corresponding to the memory cell being read and on the first input 210 of the corresponding sense amplifier (i.e., the sense amplifier coupled to this column line). The reference voltage appears on the column lines C5 and C6 which are coupled together at node N1. The reference voltage also appears on the reference node N1 as well as on the second input 220 of each of the sense amplifiers. It is noted that in the example shown, the reference voltage is a single voltage developed by both the first and second reference cells.

Figure 2B:
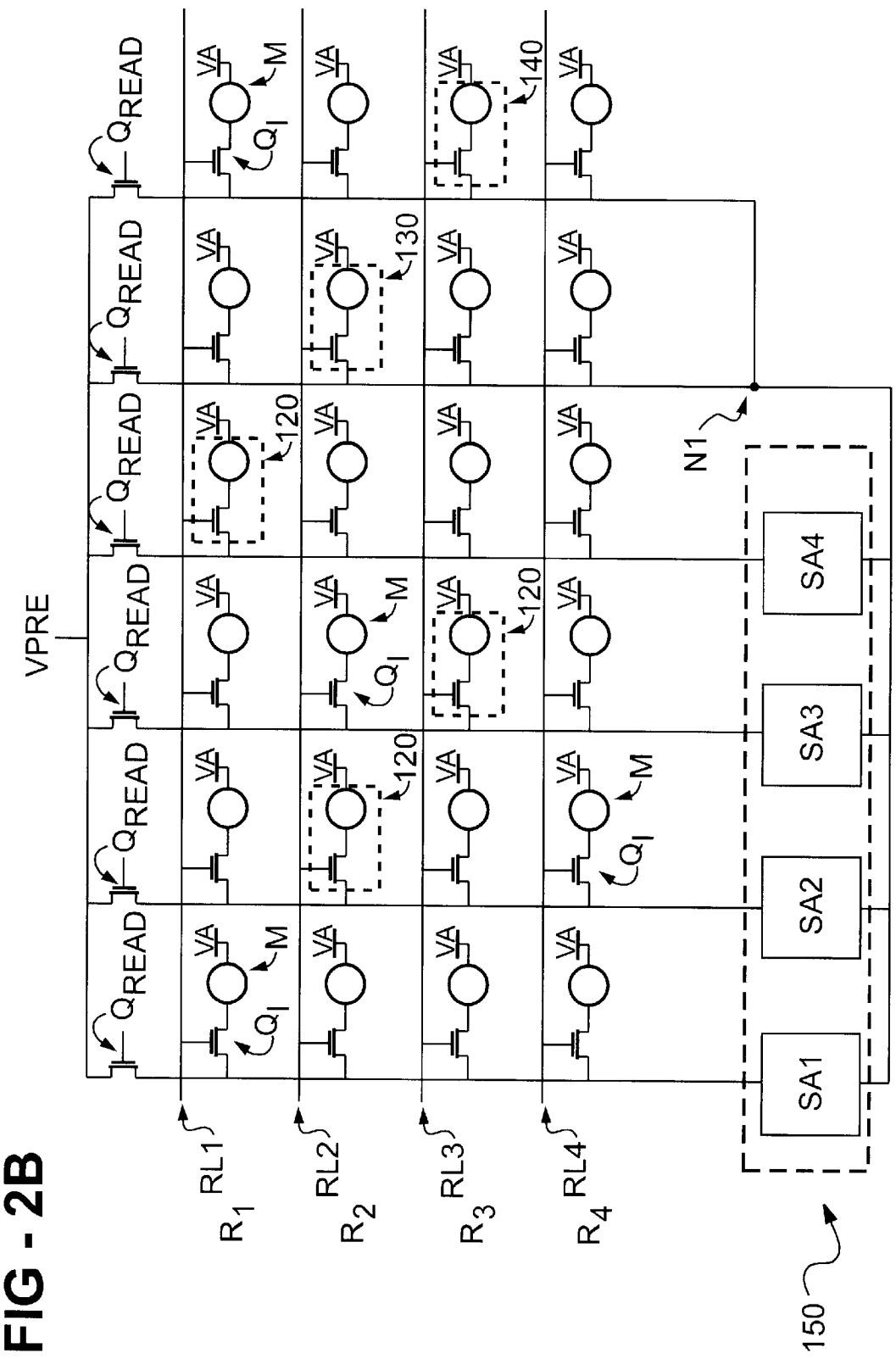
FIG. 2B is a schematic diagram of a first embodiment of present invention showing how a precharge voltage may be coupled to the column lines.

Generally, a single memory cell may be read or, alternatively, more than one memory cell may be read at the same time. In the implementation shown in FIG. 2A, an entire row of memory cells may be read at the same time. For example, to read the memory cells of row R2, all of the column lines CL1 . . . CL6 may first be "precharged" to a voltage VPRE. (It is noted that other implementations are possible where the resistance states of the memory cells are read without first precharging the column lines). The column lines may be precharged by temporarily connecting the lines to a precharge voltage source VPRE through one or more switching devices such as through the current path of one or more MOS transistors. These MOS transistors may be kept on for a period of time sufficient to charge the column lines to the voltage VPRE. An example of using MOS transistors to precharge each of the column lines is shown in FIG. 2B. FIG. 2B shows a plurality of MOS transistors $Q_{READ}$ where each transistor selectively couples a corresponding column line to the precharge voltage VPRE.

To read the memory cells of row R2, the potential on the corresponding row line RL2 is then raised or lowered to a level sufficient to switch on each of the corresponding isolation MOS transistors $Q_I$ (i.e., the transistors $Q_I$ coupled to row line RL2).

When an isolation transistor $Q_I$ is switched on, the corresponding programmable resistive element M is coupled to its respective column line. Hence, by switching on the entire row R2 of isolation transistors $Q_I$, all of the corresponding programmable resistance elements M on the same row (both memory cells as well as reference cells) are coupled to their respective column lines CL1 . . . CL6. Each programmable resistance element M is also coupled to the power line voltage source VA. Since, there is a potential difference between the power line voltage VA and the voltage on the column line, current flows through the current path of the isolation transistor $Q_I$ and through the programmable resistance element M. This current causes the column lines CL1 . . . CL6 to charge from the precharge voltage VPRE toward the power line voltage VA. Preferably, when the memory element is being read, the precharge voltage VPRE and the power line voltage VA are chosen so that the potential difference across the memory element is less than its threshold voltage. As discussed above, this is done to prevent the memory element from changing resistance states as a result of the read operation.

The time needed to charge a column line is directly proportional to the capacitance of the column line as well as the resistance of the corresponding programmable resistance element M coupled to the column line. A column line with a larger capacitance will take longer to charge than a column line with a smaller capacitance. Also, a column line coupled to a memory element in a higher resistance state will take longer to charge that a column line coupled to a memory element in a lower resistance state. Hence, the sense signals and the reference signals are related to the resistance state of the programmable resistance elements of the memory cells and reference cells, respectively.

When a row R2 of the memory array is read, each sense amplifier SA1 . . . SA4 compares the sense voltage on a corresponding column line CL1 . . . CL4 to the reference voltage on reference node N1. The columns lines CL5 and CL6 are coupled at the reference node N1 to form a "coupled line" having a capacitance which is about twice the capacitance of an individual column line in the array. The reference voltage VREF on node N1 is related to the capacitance of this coupled line as well as to the resistances of both the first reference cell 130 and second reference cell 140 in row R2. Each sense amplifier SA1 . . . SA4 compares the sense voltage on a corresponding column line CL1 . . . CL4 (which is coupled to the first input 210 of the respective sense amplifier) to the reference voltage at node N1 (which is electrically coupled to the second input 220 of each sense amplifier). In response to these comparisons, the sense amplifiers provides output signals which are indicative of the resistance state of the memory cells 130 in row R2 of the memory array 110.

As noted, in the example shown in FIGS. 2A and 2B, an entire row of memory cells is read at the same time. Alternately, other implementations are possible where only a single memory cell is selected to be read. For example, the read circuitry may use a column decoder circuit to select only one of the column lines. An example of a column decoder circuit for a memory array is provided in U.S. Pat. No. 5,883,827, the disclosure of which is incorporated herein by reference.

The example in FIGS. 2A and 2B shows only one column line CL5 of first reference cells 130 and one column line CL6 of second reference cells 140. In other embodiments, there may be a plurality of column lines of first reference cells 130 and/or a plurality of column lines of second reference cells 140 coupled together at a reference node, such as reference node N1.

As noted, in the example provided above, the reference signal is a single reference single (preferably a reference voltage) developed by both a first and a second reference cell. The single reference signal is developed on a coupled column line (i.e., CL5 coupled to CL6 at a reference node N1). This single reference signal is developed by more than one memory element (preferably by at least one memory element programmed to the first resistance state and at least one memory element programmed to the second resistance state).

Figure 2C:
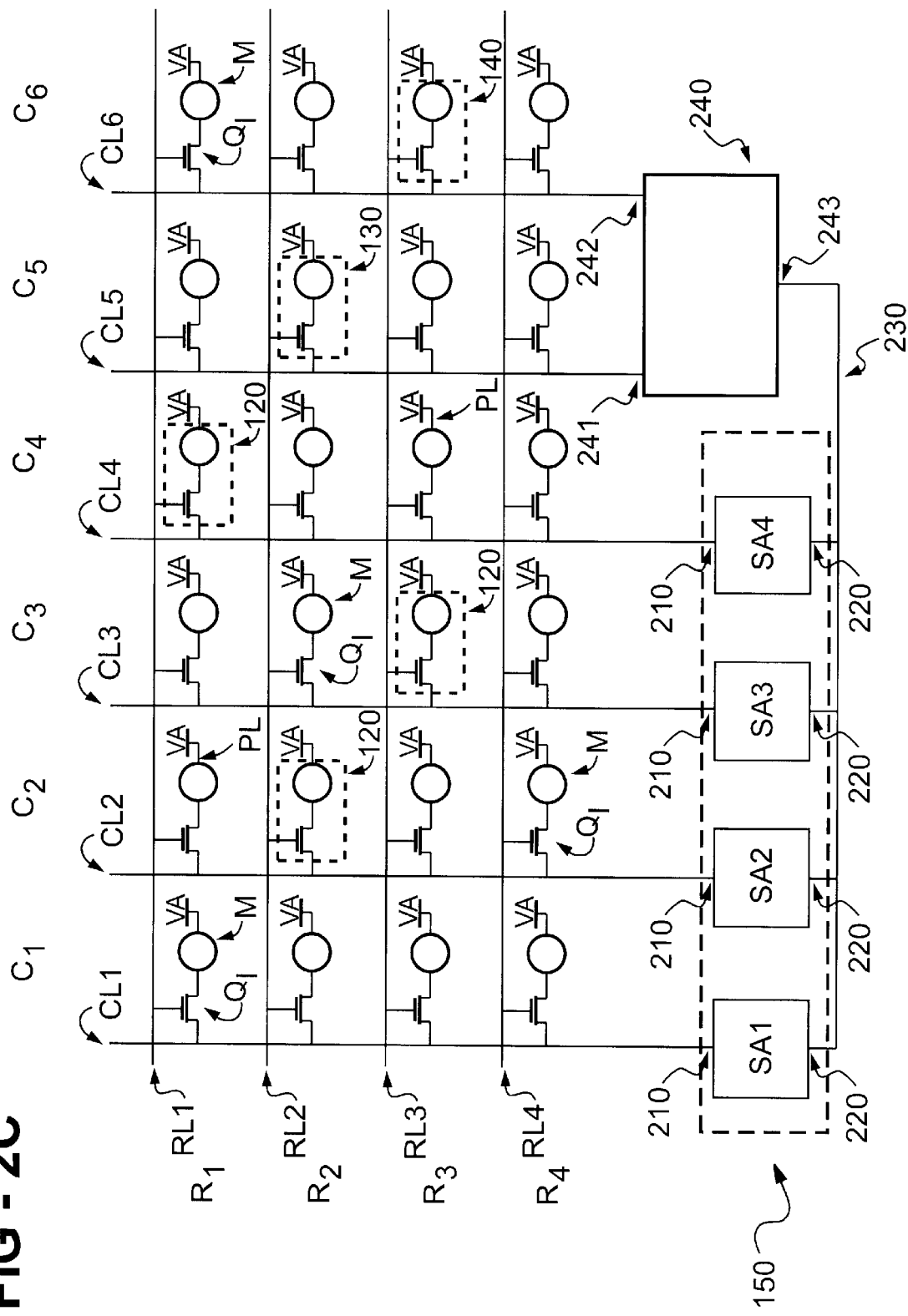
FIG. 2C is a schematic diagram of a first embodiment of the present invention showing how a signal processing circuit may be coupled to the column lines to form a reference signal.

A reference signal may also be developed by multiple memory elements in an alternative way. FIG. 2C shows a memory system which includes a signal processing circuit 240 having a first input 241 coupled to column line CL5, a second input 242 coupled column line CL6, and an output 243 coupled to the reference line RL.

In the example shown in FIG. 2C, a first signal is developed by a first reference cell 130 on CL5 and provided to first input 241, and a second signal is developed by a second reference cell 140 on CL6 and provided to second input 242. The signal processing circuit 240 "combines" the first and second signals to form a reference signal on output 243 which is compared with the sense signal developed by the memory cell. This reference signal appears on the second input 220 of each sense amplifier SA1 . . . SA4.

"Combination" refers to any linear or nonlinear electrical, adding, subtracting, multiplying, dividing, mixing, convoluting, transforming, or the like, of the first and second signals. For example, the signals may be added together and/or multiplied together. The signals may be transformed to a different domain (for example, to the frequency domain). The "combination" may be a linear combination of the first and second reference signals, such as a weighted average or an arithmetic average. Alternately, the "combination" may be a nonlinear combination of the first and second signals. For example, the signals may be multiplied or divided. Also, the combination may be the geometric mean of the first and second signals. The signal processing circuit 240 may be analog, digital or a mixture of analog and digital. An example of an analog signal processing circuit is one which connects input 241, input 242, and output 243 to a common node.

Preferably, the first signal is a first voltage developed on CL5 by directing a current through a first reference cell 130 on CL5, and the second signal is a second voltage developed by directing a current through the second reference cell 140 on CL6. As described above, there may be more than one column of first reference cells and/or more than one column of second reference cells. Preferably, the reference signal is developed by one or more first signals developed by at least one first reference cell 130 and one or more second signals developed by at least one second reference cell 140.

Figure 2D:
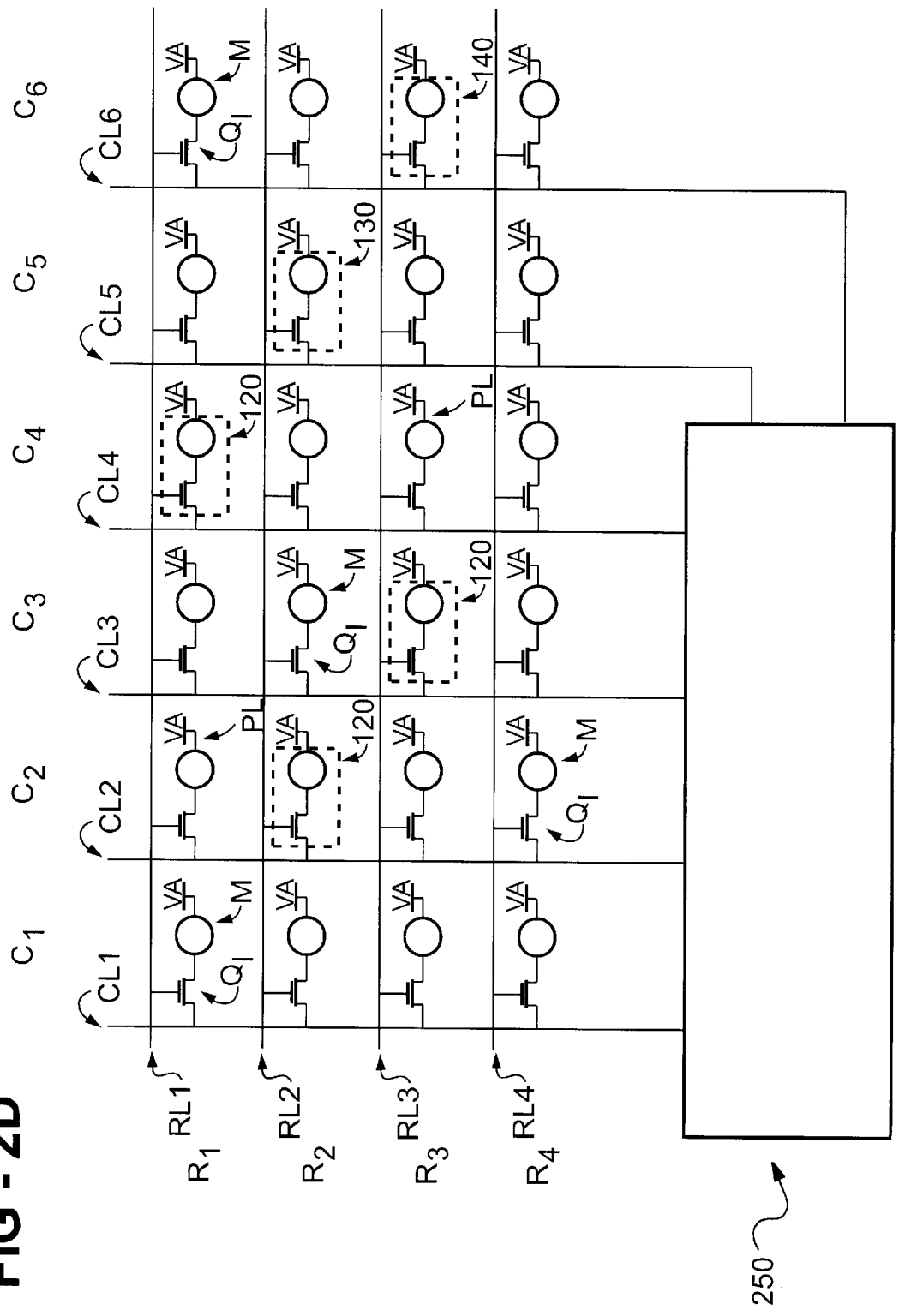
FIG. 2D is a schematic diagram of a first embodiment of the present invention showing how a specially design comparison circuit may be coupled to the column lines.

FIG. 2D shows yet another implementation of the first embodiment of the present invention. In this example, the column lines CL1 . . . CL4 as well as the column lines CL5 and CL6 are all directly coupled to a comparison circuit 250. The comparison circuit 250 uses the sense signals developed by the memory cells as well as the first and second reference signals developed by the first and second reference cells 130, 140, respectively, to determined the resistance states of the memory cells. In order words, the first and second reference signals may each be used individually (rather than combined into a single signal) to determine the resistance states of the memory cells. The comparison circuit 250 may compare a sense signal developed by a memory cell to both the first and second reference signals in order to determine the resistance state of the memory cell. Alternately, the 250 may be a digital processing circuit (such as a microprocessor based circuit), an analog processing circuit or a mixture of a digital and analog processing circuit. It also may have signal processing capabilities as well as comparison capabilities. It may use principles of artificial intelligence, such as a rule-based system, to determine the resistance state of the memory cell. It may use principles of pattern recognition.

It yet other implementations it is possible that only one of the reference cells (i.e., either the first or the second) be used to determine the resistance state of the memory cell.

There are yet additional implementations of the first embodiment of the present invention which are possible. Other arrangements are possible wherein the reference cells (either first reference cells, second reference cells, or a combination of first and second reference cells) are arranged in rows of the memory array or in both rows and columns of the memory array. Furthermore, the reference cells may not even be located on the same memory array as the memory cells.

The programmable resistance element may be a multistate memory element. An example of a multistate memory element is a programmable resistance element which is programmable to at least three detectably distinct resistance states. That is, the programmable resistance element is programmable to at least a first resistance state, a second resistance state and a third resistance state. This provides for more than one bit of data per memory cell.

One way to accurately and robustly read the resistance states of a multistate memory element is to use reference cells comprising at least one first reference cell programmed to the first resistance state, at least one second reference cell programmed to the second resistance state, and at least one third reference cell programmed to the third resistance state.

Reference signals developed by the first, second and third reference cells may be compared to sense signals developed by the memory cells to determine the resistance states of the multistate memory elements within the memory cells. The circuitry shown in FIGS. 2A–D may be extended to include an additional column of reference cells all programmed to the third resistance state. The three reference columns may be coupled together in various ways to produce reference signals that may be used to determine the resistance states of the memory cells (for example, extensions of the circuitry shown in FIGS. 2A and 2B). Furthermore, the signals from the three column lines may be processed by a signal processing circuit (for example, extensions of the circuitry shown in FIG. 2C) or even directly coupled to a specially designed comparison circuit (for example, extensions of the circuitry shown in FIG. 2D). The reference signals of the first and second reference cells may be averaged to form a first combined reference signal, and the reference signals of the second and third reference cells may be averaged to form a second combined reference signal. The first and second combined reference signals may then be used to determine the resistance states of the multistate memory cells.

Generally, because the reference signals are developed from reference cells having the same type of programmable resistance elements as the memory cells, the variations and drift in the resistance values of the memory cells will be "tracked" (and compensated for) by corresponding variations and drift in the reference cells. This results in a highly robust and accurate system for reading the data stored in the memory cells.

In the examples shown above, the memory cells and the reference cells are in the same memory array. However, the memory cells and the reference cells used to determine the resistance states of these memory cells may be in different memory arrays. (In addition, it is possible that the reference programmable resistance elements be located on peripheral circuitry).

In a second embodiment of the present invention, the memory system comprises at least a first memory array and a second memory array. Each of the first and the second memory arrays comprises at least one memory cell, and preferably each comprises a plurality of memory cells operable to provide data storage. Each of the first and second memory arrays further comprises at least one reference cell used for determining the resistance state of the memory cells of the other array. That is, the at least one reference cell in the first memory array is used in determining the resistance state of one or more of the memory cells in the second memory array. Likewise, the at least one reference cell in the second memory array is used in determining the resistance state of one or more of the memory cells in the first memory array.

The at least one reference cell of the first array is preferably a plurality of reference cells comprising at least one first reference cell and at least one second reference cell. The reference cells of the first array are preferably arranged as one or more "pairs of reference cells" where each pair of reference cells includes a first reference cell and a second reference cell.

Likewise, the at least one reference cell of the second array is preferably a plurality of reference cells comprising at least one first reference cell and at least one second reference cell. The reference cells of the second array are preferably arranged as one or more "pairs of reference cells" where each pair of reference cells includes a first reference cell and a second reference cell.

In the second embodiment of the present invention, the memory system further comprises a comparison circuit. The comparison circuit is adapted to compare one or more sense signals developed by the plurality of memory cells in the first memory array to one or more reference signals developed by the at least one reference cell in the second memory array and to provide output signals in response to the comparisons. The comparison circuit is also adapted to compare one or more sense signals developed by the plurality of memory cells in the second memory array to one or more reference signals developed by the at least one reference cell in the first memory array and to provide output signals in response to the comparisons. The comparison circuit may also be adapted to latch or store the sense signals and the reference signals. Preferably, the sense signals and reference signals relate to the resistances of the programmable resistance elements of the memory cells and reference cells, respectively. The output signals provided by the comparison circuit are preferably indicative of the resistance state of one or more of the memory cells in the first memory array and/or the second memory array.

Figure 5:
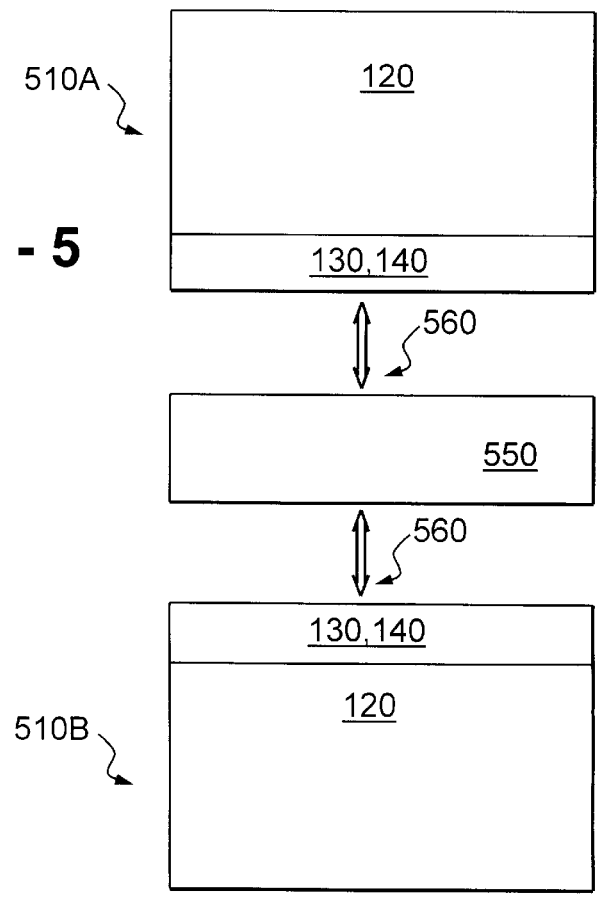
FIG. 5 is a block diagram of a second embodiment of the present invention showing a comparison circuit in electrical communication with a first and second memory array.

An implementation of the second embodiment of the present invention is shown in FIG. 5. FIG. 5 is a block diagram showing a possible arrangement of memory cells and reference cells. As shown, the memory system comprises a first memory array 510A and a second memory array 510B. The first memory array 510A and the second memory array 510B each comprise a plurality of memory cells which are arranged in one or more rows of the arrays. That is, each memory array comprises one or more rows of memory cells. Furthermore, each memory array preferably comprises a plurality of reference cells arranged in one or more rows of the arrays. That is, each memory array comprises one or more rows of reference cells. Preferably, each row of reference cells includes at least one first reference cell 130 and at least one second reference cell 140 (shown in FIG. 5 as reference cells "130,140"). The plurality of memory cells 120, the at least one first reference cell 130, and the at least one second reference cell 140 are in electrical communication with a comparison circuit 550. The electrical communication is represented by the double arrows 560 in FIG. 5.

A detailed example of the block diagram of FIG. 5 is shown in FIG. 6. Each of the memory arrays 510A,B comprises rows R1 . . . R4 and columns C1 . . . C4. For first array 510A, the memory cells 120 are arranged in rows R1 . . . R3 and columns C1 . . . C4 while the first and second reference cells 130, 140 are arranged in row R4 and columns C1 . . . C4. For the second array 510B, the memory cells 120 are arranged in rows R2 . . . R4 and columns C1 . . . C4 while the first and second reference cells 130, 140 are arranged in row R1 and columns C1 . . . C4. Generally, the memory arrays 510A,B are not limited to any particular number of rows or any particular number of columns. Furthermore, the reference cells 130, 140 may be arranged in more than one row of each array. As well, the one or more rows of reference cells is not limited is any specific location (i.e., the placement of the one or more rows of reference cells may be varied).

In the first array 510A, the row R4 of reference cells include first reference cells 131A and 132A in columns C1 and C3, respectively. The row R4 also includes second reference cells 141A and 142A in columns C2 and C4, respectively. The reference cells 131A, 141A form a pair of reference cells. Likewise, the reference cells 132A, 142A form another pair of reference cells.

In the second array 510B, the row R1 of reference cells include first reference cells 131B and 132B in columns C1 and C3, respectively. The row R1 also includes second reference cells 141B and 142B in columns C2 and C4, respectively. The reference cells 131B, 141B form a pair of reference cells. Likewise, the reference cells 132B, 142B form another pair of reference cells.

Each of the memory arrays 510A and 510B further comprises a plurality of row lines and a plurality of column lines. Each row line is associated with a corresponding row of a memory array and is coupled to the memory cells and/or reference cells which are in the corresponding row. Each column line is associated with a corresponding column of a memory array and is coupled to the memory cells and/or reference cells in the corresponding column. Referring to FIG. 6, a set of row lines RL1 . . . RL4 and a set of column lines CL1 . . . CL4 are associated with the rows R1 . . . R4 and columns C1 . . . C4 of the first memory array 510A. Likewise, a set of row lines RL1 . . . RL4 and a set of column lines CL1 . . . CL4 are associated with the rows R1 . . . .R4 and columns C1 . . . C4 of the second memory array 510B. The examples of memory cell configurations from The memory and reference cell configurations shown in FIGS. 3 and 4 are applicable to the embodiment shown in FIG. 6. Of course, the present invention is not limited to these examples. (Other configurations and other types of isolation elements may be used).

As noted above, and as shown in FIG. 6A, the second embodiment of the memory system further comprises a comparison circuit 550 which compares one or more sense signals developed by the memory cells of one of the memory arrays to one or more reference signals developed by the reference cells of the other memory array. In the example provided in FIG. 6A, the comparison circuit 550 comprises a plurality of sense amplifiers SA1 . . . SA4. Preferably, the number of sense amplifiers corresponds to the number of columns in each of memory arrays. (In the example provided, each of the memory arrays has four columns and their is a corresponding number (i.e., four) of sense amplifiers.) Each of the column lines CL1 . . . CL4 of the first memory array 510A is coupled to a first input 551 of a corresponding sense amplifier SA1 . . . SA4. Likewise, each of the column lines CL1 . . . CL4 of the second memory array 510B is coupled to a second input 552 of the corresponding sense amplifier SA1 . . . SA4.

The column lines corresponding to reference cell pairs are selectively coupled together through a switching means. For first memory array 510A, column line CL1 is selectively coupled to column line CL2 through the current path of MOS transistor Q11. Also, column line CL3 is selectively coupled to column line CL4 through the current path of MOS transistor Q12. For the second array 510B, column line CL1 is selectively coupled to column line CL2 through the current path of MOS transistor Q21. Also, column line CL3 is selectively coupled to column line CL4 through the current path of MOS transistor Q22. The column lines CL1 and CL2, and the column lines CL3 and CL4 (of both the first and second arrays) form "column line pairs". It is noted that the column lines in a column line pair are coupled together when the appropriate transistor Q11, Q12, Q21, Q22 is switched on.

As discussed above, the reference cells of the first memory array 510A develop reference signals used to determine the resistance state of the memory cells of second memory array 510B. When the memory cells of the first array 510A are being read, the Q11 and Q12 are switched off. However, the transistors Q21 and Q22 are switched on so that column lines CL1 and CL2 of the second array are coupled together, and so that the column lines CL3 and CL4 of the second array are also coupled together.

Likewise, the reference cells of the first array 510A develop reference signals used to determine the resistance state of the memory cells of the second array 510B. When the memory cells of the second array 510B are being read, the transistors Q21 and Q22 are switched off. However, the transistors Q11 and Q12 are switched on so that the column lines CL1 and CL2 of the first array 510A are coupled together, and so that column lines CL3 and CL4 of the first array 510A are also coupled together.

Figure 6A:
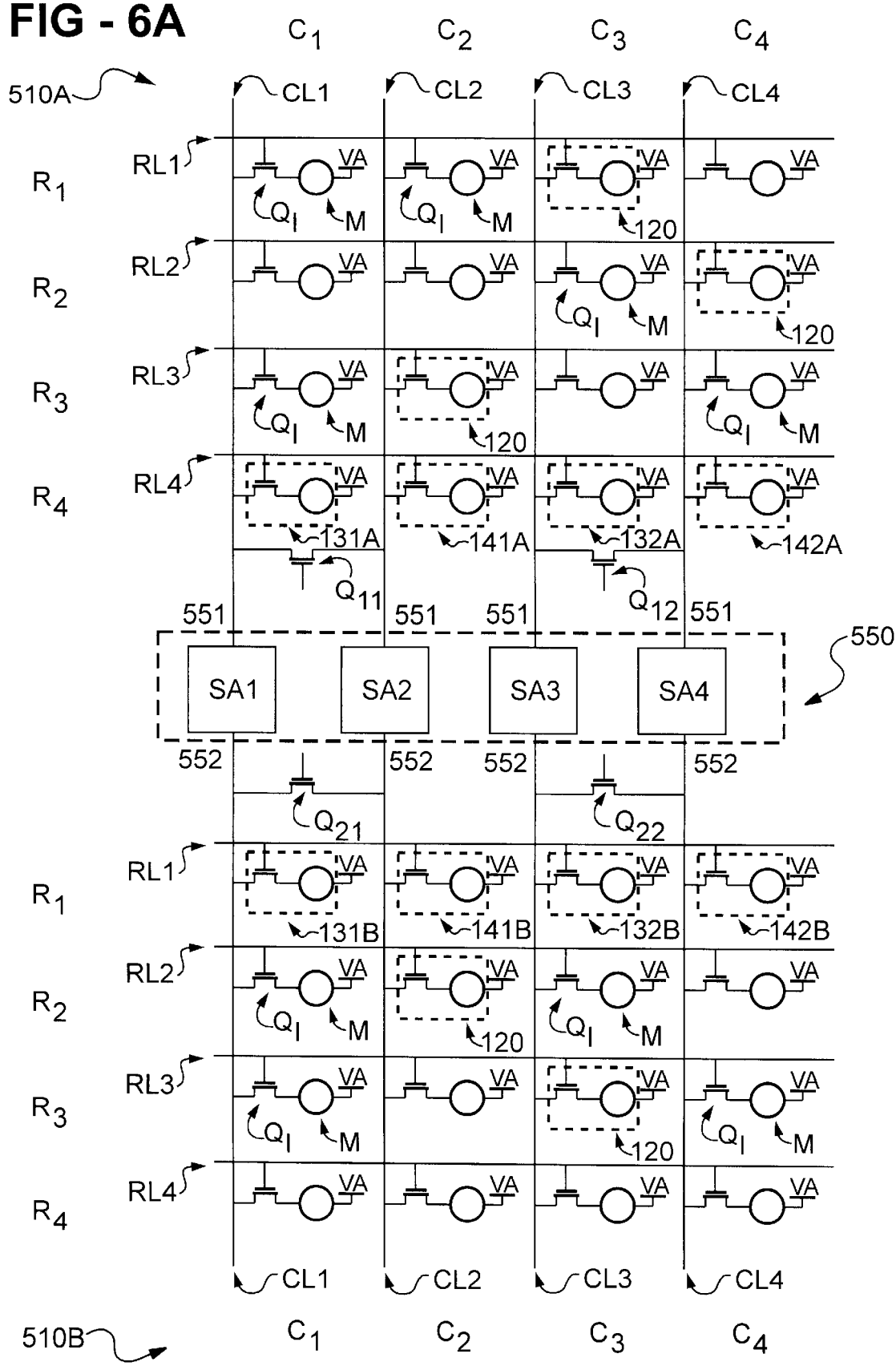
FIG. 6A is a schematic diagram of a second embodiment of the present invention.

Referring to FIG. 6A, the resistance state of an entire row of memory cells 120 of either the first or second memory arrays 510A,B may be determined at the same time. For example, to read the resistance states of the memory cells 120 in row R2 of first array 510A, all of the column lines C1 . . . C4 of both the first and second arrays may first be "precharged" to a voltage VPRE. Referring to FIG. 6B, the column lines may be precharged by temporarily coupling the column lines to a precharge voltage VPRE. The column lines may be selectively coupled to the voltage VPRE through the current path of one or more MOS transistors. FIG. 6B shows an implementation using a plurality of MOS transistors $Q_{READ}$. To precharge the column lines, the transistors (normally off) may be switched on for a sufficient period of time to charge the column lines to the precharge voltage VPRE and then switched back off. It is noted that other implementations are also possible where the resistance states of the memory cells of either first or the second memory array may be read without first precharging the column lines. Also, other implementations are possible where a selected one of the memory cells is read (rather than entire rows). For example, as discussed above, it is possible to provide read circuitry with column decoders so that only a single column line is selected.

Depending on which of the arrays 510A,B is being read, the appropriate MOS transistors Q11, Q12, Q21, Q22 are switched on or off. In the above example, the memory cells in row R2 of the first array 510A are being read, hence, the transistors Q21 and Q22 are switched on while Q11 and Q12 are switched off so that only column lines of the second array are coupled together. Hence, CL1 of the second array will be coupled to CL2 of the second array, and CL3 of the second array will be coupled to CL4 of the second array.

To read row R2 of memory cells 120 of the first array 510A, the row line RL2 of the first array and the row line RL1 of the second array (the row line coupled to the reference cells) are "selected". This is preferably done by raising or lowering the line voltages so as to switch on the corresponding isolation transistors $Q_I$ (i.e., those connected to these row lines). This couples each column line CL1 . . . CL4 to the corresponding memory element M and develops a potential difference across the memory element M, thereby allowing current to flow through the memory elements and allowing the column lines to charge from the precharge voltage VPRE toward the voltage VA. As discussed above, the time needed to charge each column line is directly proportional to the capacitance of the column line and to the resistance of the corresponding programmable resistance element M coupled to the column line.

In one implementation, the appropriate row lines may be selected (in the above example, RL2 of the first array 510A and RL1 of the second array 510B) after the appropriate column lines are coupled together (in the above example, CL1 of the second array 510B to CL2 of the second array 510B, and CL3 of the second array 510B to CL4 of the second array 510B).

When row line R2 of the first array is read, each sense amplifier SA1 . . . SA4 compares the sense voltage on a column line CL1 . . . CL4 of the first array to the reference voltage on the corresponding column line CL1 . . . CL4 of the second array. In order to develop the reference voltages, the column lines CL1 and CL2 of the second array 510B are coupled together through the current path of Q21, and column lines CL3 and CL4 of the second array 510B are coupled together through the current path of Q22. Coupling CL1 to CL2 forms a coupled line "CL1/CL2" with approximately twice the capacitance of an individual standard line in either array and provides for a common reference voltage VREF1 on both CL1 and CL2. The reference voltage VREF1 is developed by both the first and second reference cells 131B, 141B. Preferably, it is developed by directing currents through the resistance elements of the first and second cells 131B, 141B in row R1 of array 510B, respectively. The reference voltage VREF1 is related to the capacitance of the coupled line CL1/CL2 as well as to the resistances of both of these resistance elements.

Likewise, coupling CL3 to CL4 forms a coupled line "CL3/CL4" with about twice the capacitance of a standard column line of the array and provides for a common reference voltage VREF2. The reference voltage VREF2 is developed by both the first and second reference cells 132B, 142B. Preferably, the reference voltage VREF2 is developed by directing currents through the memory elements of the first and second reference cells 132B, 142B of row R1 of array 510B.

Sense amplifier SA1 compares the sense signal on CL1 of the first array 510A to the reference signal VREF1 on CL1 of the second array 510B. Sense amplifier SA2 compares the sense signal on CL2 of the first array to the reference signal VREF1 on CL2 of the second array. Sense amplifier SA3 compares the sense signal on CL3 of the first array to the reference signal VREF2 on CL3 of the second array. Sense amplifier SA4 compares the sense signal on CL4 of the first array to the reference signal VREF2 on CL4 of the second array. In response to these comparisons, the sense amplifiers SA1 . . . SA4 provides output signals which are preferably indicative of the resistance states of the memory cells 130 in row 2 of the first array 510A.

It is noted that in the example provided in FIGS. 6A and 6B, the reference signals VREF1 and VREF2 are each developed by one first reference cell and one second reference cell. In general, each of the reference signals may be developed by at least one first reference cell and/or at least one second reference cell. Preferably, each of the reference signals is developed by at least one first reference cell and at least one second reference cell. More preferably, each of the reference signals is a reference voltage developed by directing currents through at least one first reference cell and at least one second reference cell. More than one column line coupled to a first reference cell and/or more than one column line coupled to a second reference cell may all coupled together.

Figure 6C:
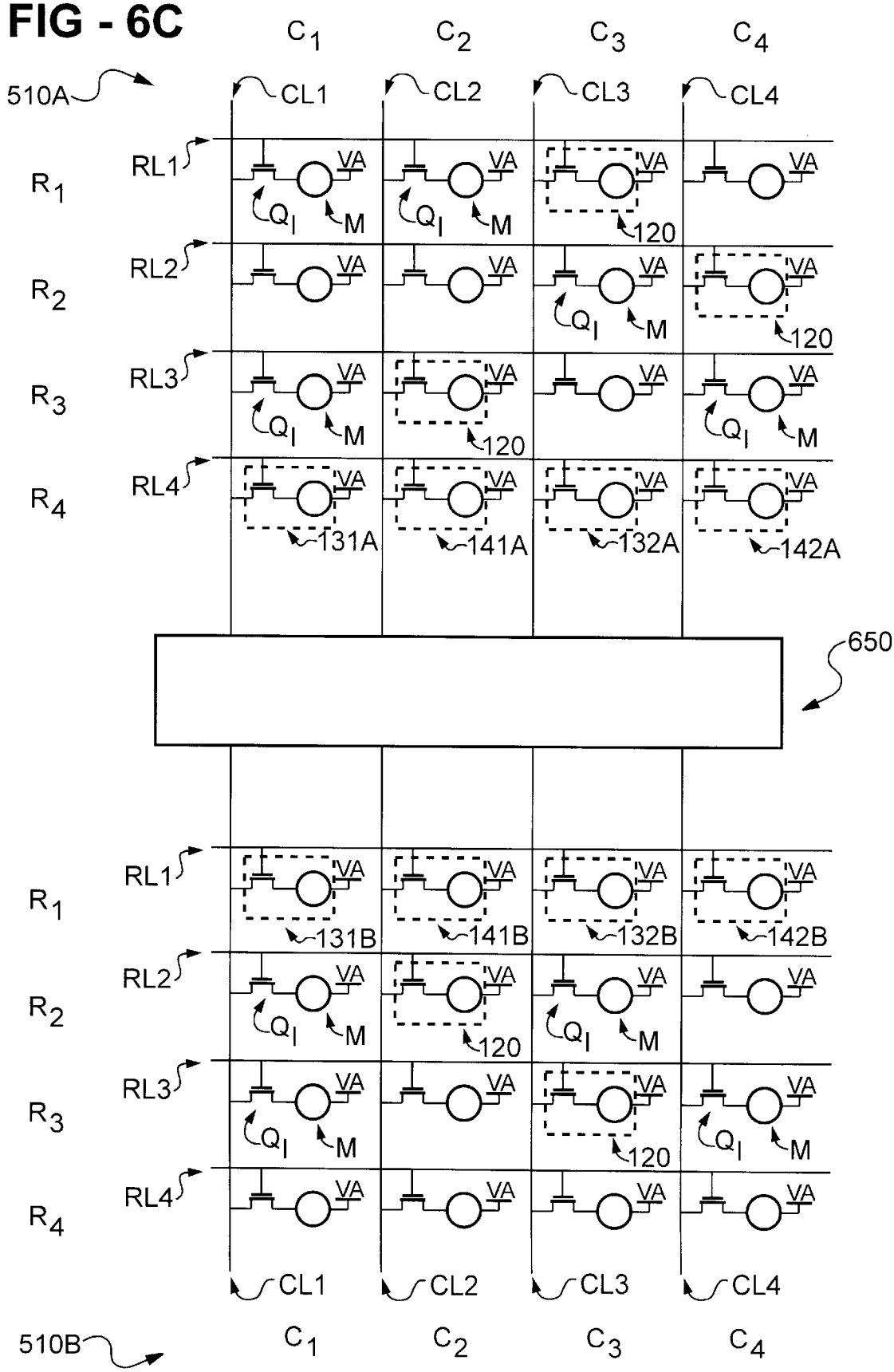
FIG. 6C is a schematic diagram of a second embodiment of the present invention showing how the column lines may be coupled to a specially designed comparison circuit.

Alternative implementations of the present invention are possible. Referring to FIG. 6C, all of the columns may be coupled to a specially designed comparison circuit 650. The circuit 650 may form reference signals for each of the arrays 510A,B by "combining" two or more individual signals developed by the reference cells of the corresponding array.

For example, the signal comparison circuit 650 may form a "combined" reference voltage for array 510B by combining first voltage developed by first reference cell 131B and a second voltage developed by second reference cell 141B. The concept of combining signals was described above and refers to any linear of nonlinear combining, mixing, or convoluting of electrical signals. A reference signal may be formed by adding and/or multiplying and/or dividing individual signals developed the reference cells. In the example shown in FIG. 6C, it is also possible that the comparison circuit 650 be designed so that it could compare the sense signal developed by the memory cell to more than one reference signal (i.e., a first reference signal developed by a first reference cell and to a second reference signal developed by a second reference cell).

In the implementation of the present invention shown in FIGS. 6A–C, the sense signals and reference signals are developed by memory cells and reference cells which all include substantially identical types of memory elements. Hence, when the memory cells are read, any deviation over time in their resistance values will be compensated for by similar temporal deviations in the reference cells. Also, it is seen that any memory cell being read will be compared to two reference cells located in columns of the other memory array which is either identically positioned or one column over (for example a memory cell in column C1 of the first array will be compared to reference cells in columns C1 and C2 of the second array, etc). Hence, any deviation or drift occurring across the columns (that is, from column to column) of one of the arrays will also be compensated for by similar column-to-column deviations in the other memory array. Hence, the memory system of the present invention provides for a highly robust and accurate way to read the resistance states of the memory cells. It is noted that the second embodiment of the present invention is not limited to the implementation shown in FIGS. 6A–C. Other arrangements are also possible whereby the reference cells (either first reference cells, second reference cells, or a combination of first and second reference cells) are arranged in columns of the memory arrays or in both rows and columns of the memory arrays. Furthermore, the reference cells may not even be located on the same memory arrays as the memory cells.

The second embodiment of the memory system of the present invention is also applicable to a multistate memory element having at least three resistance states. The resistance states of multistate memory elements in the first memory array may be determined with use of one or more reference cells in the second array. Likewise, the resistance states of multistate memory elements in the second array may be determined with the use of one or more reference cells in the first array. Preferably, the reference cells in each of the memory arrays is a plurality of reference cells comprising at least a first, second and third reference cell where the first reference cell is programmed to the first resistance state, the second reference cell is programmed to the second resistance state and the third reference cell is programmed to the third resistance state. A reference signal may be developed by a first, second and third reference cell (or more generally by at least one first, at least one second and at least one third reference cell).

When a memory cell is read, it is desirable that the read operation does not change the state of the memory element. For example, when the memory element is read while it is in the high resistance state, it is preferable that the electrical energy applied to the memory element does not program the memory element to its low resistance state. A memory element may be programmed from its high resistance state to its low resistance state when the voltage across the memory element goes above its threshold voltage. Hence, when the memory element is read, the voltage across the memory element device is preferably kept below its threshold voltage.

When a memory element is read, the voltage across the memory element may be kept below its threshold value by appropriately selecting the value of the precharge voltage VPRE. For example, the value of the precharge voltage VPRE may be selected so that the voltage drop across the memory element is less than the device threshold voltage. The precharge voltage VPRE may be a ground voltage.

Referring to the embodiments of the memory cell shown in FIGS. 3 and 4, during a read operation, the voltage values across the memory element may also be kept below its threshold value by appropriately selecting a power line voltage VA which is sufficient to limit the voltage across the memory element so that it is below the device threshold value. Hence, the power line voltage may be a variable voltage having at least two voltage values—a first voltage value VA1 used when the memory element is read (i.e., reading data from the memory cell), and a second voltage value VA2 used when the memory element is programmed to either the first or second resistance states (i.e., when data is written to the memory cell).

Hence, a method of operating the memory system of the present invention comprises a reading step where the power line voltage source VA is programmed to a first voltage VA1 and a writing step where the power line voltage VA is programmed to a second voltage VA2.

Alternately, the memory element may be read by first precharging the column line to a precharge voltage. The row line may then be set to a first voltage which is sufficient to cause a current to the flow through the programmable resistance element. This may be a voltage sufficient to turn on the isolation element. The current flowing through the programmable resistance element may then charge the column line from the precharge voltage to a second voltage.

The voltage on the column line may then be compared to a reference voltage where the reference voltage itself is developed by a reference cell including a programmable resistance element. The reference voltage may be developed by directing a current through the reference cell. After the comparing step, the comparator may provide an output signal (in response to the comparing step) which is preferably indicative of the resistance state of the programmable resistance element of the memory cell.

As described above, the memory system of the present invention comprises a comparison circuit which is adapted to compare sense signals from one or more memory cells to reference signals from one or more reference cells. As described, the comparison circuit may be implemented by using one or more sense amplifiers.

An example of a sense amplifier 70 which may be used in the present invention is shown in FIG. 7. Referring to FIG. 7, PMOS transistor Q71 and NMOS transistor Q72 form a first CMOS inverting amplifier. Likewise, PMOS transistor Q73 and NMOS transistor Q74 form a second CMOS inverting amplifier. The inverting amplifiers form a cross-coupled latch. The first and second CMOS inverting amplifiers are cross coupled so that when one turns on, it forces the other one to turn off. NMOS transistor Q75 is an isolation transistor which selectively couples a first input line LINE1 to the gates of transistor Q73 and Q74 of the second inverting amplifier. Likewise, NMOS transistor Q76 is an isolation transistor which selectively couples a second input line LINE2 to the gates of transistor Q71 and Q72 of the first inverting amplifier. When the isolation transistor Q75 is turned on, this couples the first input line LINE1 to the gates of Q73 and Q74. Since the capacitance of the gates is small compared to the capacitance on the first input line, the voltage on the gates is substantially equal to the voltage on the first input line. Likewise, when the isolation transistors Q76 is turned on, this couples the second input line LINE2 to gates of Q73 and Q74. The voltage on the gates of Q73 and Q74 is substantially equal to the voltage on the second input line. The NMOS transistor Q77 selectively couples the source of transistors Q72 and Q74 to ground. When transistor Q77 is turned on, this biases the source of transistors Q72 and Q74 so that both the first and second inverting amplifiers may begin to discharge. Assuming, for example, that the voltage on input line LINE1 is higher than the voltage on input line LINE2, then the gate voltage on the second inverting amplifier will be higher than the gate voltage on the first. The second inverting amplifier will conducts faster than the first and will discharge the gate of the first. However, substantial charge remains on the gate of the second amplifier.

The PMOS transistor Q78 selectively couples the source of transistors Q71 and Q73 to the voltage source VCC. When transistor Q78 is turned on, both of the inverting amplifiers turn on. The amplifier with the charge on the gate, i.e., the second inverting amplifier, will switch low, forcing the first amplifier to switch high. The states of the first and second amplifiers are now in a stable (i.e., latched) condition and can be read by other circuitry.

The sense amplifier shown in FIG. 7 may be used in the example shown in FIG. 2A. Specifically, first input line LINE1 of the sense amplifier may be coupled to one of the column lines C1 . . . C4 from the memory array shown in FIG. 2A. The second input line LINE2 may be coupled to the reference node N1. The sense amplifier may also be used in the example shown in FIG. 6A. Specifically, the first input line LINE1 of the sense amplifier may be coupled to one of the column lines C1 . . . C4 of the first memory array 510A while the second input line LINE2 may be coupled to a corresponding column line C1 . . . C4 of the second memory array 510B.

Another embodiment of the present invention is a memory system comprising at least a first programmable resistance element which is programmable to at least a first resistance state and a second resistance state; at least a second programmable resistance element programmable to at least the first resistance state and the second resistance state where the second element is programmed to the first resistance state; at least a third programmable resistance element programmable resistance element programmable to at least the first resistance state and the second resistance state where the third element is programmed to the second resistance state; and a comparison circuit adapted to compare a sense signal developed by the first element with at least one reference signal developed by at least the second element and/or the third element, and to provide at least one output signal in response to the comparisons.

Preferably, the at least one reference signal comprises a reference signal developed by at least the second element and the third element. More preferably, the at least one reference signal is a reference signal developed by the second element and the third element. Alternately, the at least one reference signal may be a first reference signal developed by at least the second programmable resistance element and a second reference signal developed by at least the third programmable resistance element. Most preferably, the sense signal is a sense voltage, the at least one reference signal is a reference voltage, the comparison circuit is adapted to compare the sense voltage with the reference voltage and provide an output signal in response to the comparison. The sense voltage may be developed by directing a current through the first programmable resistance element. The reference voltage may be developed by directing currents through the second and third programmable resistance elements.

As described above, the programmable resistance element of the memory system of the present invention is programmable to at least a first resistance state and a second resistance state. The programmable resistance element may be directly overwritable so that it can be programmed to a specific resistance state (for example, the first or the second resistance state) without the need to first be programmed to any starting state. The programmable resistance element may be a programmable resistor.

The programmable resistance element preferably comprises a volume of memory material which is programmable to at least a first and a second resistance state. Preferably, the volume of memory material is a phase-change material. The phase-change material is preferably formed from a plurality of constituent atomic elements. For example, the phase-change material may include one or more elements selected from the group consisting of Te, Se, Ge, Sb, Bi, Pb, Sn, As, S, Si, P, O and mixtures or alloys thereof. Preferably, the phase-change material includes at least one chalcogen element. Preferably, the at least one chalcogen element is selected from the group consisting of Te, Se and mixtures or alloys thereof. The at least one chalcogen element may be a mixture of Te and Se.

An example of a phase-change memory material is a composition where the average concentration of Te is preferably less than about 70%, and more preferably between about 40% and about 60%. The concentration of Ge in the material is preferably greater than about 5%, more preferably between about 8% and about 50%, and most preferably between about 10% and about 44%. The remainder of the principal constituent elements is Sb. The percentages given are atomic percentages which preferably total 100% of the atoms of the constituent elements. Thus, this composition may be characterized as $Te_a Ge_b Sb_{100-(a+b)}$. These ternary Te—Ge—Sb alloys are useful starting materials for the development of additional phase-change materials having even better electrical characteristics.

The phase-change material may include at least one transition metal element. The term "transition metal" as used herein includes elements 21 to 30, 39 to 48, 57 and 72 to 80. Preferably, the transition metal element is selected from the group consisting of Cr, Fe, Ni, Nb, Pd, Pt and mixtures or alloys thereof. Most preferably the transition metal is Ni. Specific examples of such multi-element systems are set forth hereinafter with respect to the Te:Ge:Sb system with or without Ni and/or Se. The phase-change materials which include transition metals are elementally modified forms of the phase-change materials in the Te—Ge—Sb ternary system. That is, the elementally modified phase-change materials constitute modified forms of the Te—Ge—Sb phase-change alloys. This elemental modification is achieved by the incorporation of transition metals into the basic Te—Ge—Sb ternary system, with or without an additional chalcogen element, such as Se.

An example of an elementally modified phase-change material is a phase-change material which includes Te, Ge, Sb and a transition metal, in the ratio $(Te_a Ge_b Sb_{100-(a+b)})_c TM_{100-c}$ where the subscripts are in atomic percentages which total 100% of the constituent elements, wherein TM is one or more transition metals, a and b are as set forth herein above for the basic Te—Ge—Sb ternary system and c is preferably between about 90% and about 99.99%. The transition metal preferably include Cr, Fe, Ni, Nb, Pd, Pt and mixtures or alloys thereof.

Another example of an elementally modified phase-change material is a phase-change material which includes Te, Ge, Sb, Se and a transition metal, in the ratio $(Te_a Ge_b Sb_{100-(a+b)})_c TM_d Se_{100-(c+d)}$ where the subscripts are in atomic percentages which total 100% of the constituent elements, TM is one or more transition metals, a and b are as set forth hereinabove for the basic Te—Ge—Sb ternary system, c is preferably between about 90% and 99.5% and d is preferably between about 0.01% and 10%. The transition metal preferably includes Cr, Fe, Ni, Pd, Pt, Nb and mixtures or alloys thereof.

The memory element includes means for applying the energy to the volume of memory material. When the energy is electrical energy, the memory element may include electrical contacts for supplying the voltage or current to the volume of memory material. The shape of the contacts as well as their positioning relative to the volume of memory material may be varied to form different device structures. As an example, the electrical contacts may include first and second contacts positioned adjacent to the memory material. An example of a memory element design is provided in U.S. patent application Ser. No. 09/276,273, the disclosure of which is incorporated herein by reference.

A characteristic of electrical memory devices, is its resistance to dosages of radiation. This is referred to as the "radiation hardness" of the device. In particular, radiation penetrating semiconductor materials such as silicon and silicon oxides may be affected by doses of radiation. For example, the radiation generates mobile electrons and holes in the silicon oxide. The holes are quickly trapped and immobilized near the interface of the silicon oxide and silicon where their charges change the electrical characteristics of the device.

Various techniques have been developed for forming or treating the silicon oxide so as to improve the radiation hardness of the device. Preferably, the memory system of the present invention are preferably adapted to be "radiation hard", that is, resistant to radiation.

It is to be understood that the disclosure set forth herein is presented in the form of detailed embodiments described for the purpose of making a full and complete disclosure of the present invention, and that such details are not to be interpreted as limiting the true scope of this invention as set forth and defined in the appended claims.

We claim:

1. A memory system, comprising:
   one or more memory cells, each of said memory cells including a programmable resistor programmable to at least a first resistance state and a second resistance state;
   one or more reference cells, each of said reference cells including a programmable resistor programmable to at least said first resistance state and said second resistance state; and
   a comparison circuit in communication with said memory cells and with said reference cells, said comparison circuit adapted to compare at least one sense signal developed by at least one of said memory cells with at least one reference signal developed by at least one of said reference cells and to provide at least one output signal in response to said comparisons.

2. The memory system of claim 1, wherein each of said at least one sense signal is developed by directing at least one sense current through the programmable resistor of at least one of said memory cells, and each of said at least one reference signal is developed by directing at least one reference current through the programmable resistor of at least one of said reference cells.

3. The memory system of claim 1, wherein said at least one sense signal and said at least one reference signal are voltages.

4. The memory system of claim 1, wherein said one or more reference cells is a plurality of reference cells including one or more first reference cells programmed to said first resistance state and one or more second reference cells programmed to said second resistance state.

5. The memory system of claim 4, wherein said at least one reference signal includes a reference signal developed by at least one of said first reference cells and at least one of said second reference cells.

6. The memory system of claim 4, wherein said at least one reference signal includes a reference signal which is a combination of a first signal developed by at least one of said first reference cells and a second signal developed by at least one of said second reference cells.

7. The memory system of claim 4, wherein said at least one reference signal includes a reference signal developed by at least one of said first reference cells.

8. The memory system of claim 4, wherein said at least one reference signal includes a reference signal developed by at least one of said second reference cells.

9. The memory system of claim 4, wherein said at least one reference signal is a plurality of reference signals including a first reference signal developed by at least one of said first reference cells and a second reference signal developed by at least one of said second reference cells.

10. The memory system of claim 1, wherein said at least one sense signal includes a sense signal developed by one of said memory cells.

11. The memory system of claim 1, wherein the programmable resistor of said at least one memory cell and said at least one reference cell comprises a phase-change material.

12. The memory system of claim 1, wherein the programmable resistor of said at least one memory cell and said at least one reference cell comprises a chalcogen element.

13. The memory system of claim 1, wherein each of said memory cells and each of said resistance cells is programmable to at least three resistance states.

14. The memory system of claim 13, wherein said one or more reference cells is three or more reference cells, each of said reference cells programmable to a unique one of said at least three resistance states.

15. The memory system of claim 1, wherein said comparison circuit is further adapted to latch said at least one sense signal and said at least one reference signal.

16. The memory system of claim 1, wherein said system is adapted to be radiation hard.

17. The memory system of claim 1, wherein said reference cells includes one or more pairs of reference cells, each of said pairs of reference cells including a first reference cell programmed to said first resistance state and a second reference cell programmed to said second resistance state.

18. The memory system of claim 17, wherein at least one of said reference signals in developed by at least one of said pairs of reference cells.

19. The memory system of claim 17, further comprising:
   one or more pairs of column lines, each of said pairs of column lines including a first column line coupled to a corresponding first reference cell of each of said pairs of reference cells and a second column line coupled to a corresponding second reference cell of each of said pairs of reference cells,
   wherein said first column line of each of said pairs of column lines is selectively coupled to said second column line of the same pair.

20. The memory system of claim 1, wherein said memory cells and said reference cells are arranged in rows and columns of an array.

21. The memory system of claim 1, wherein said memory cells are arranged in rows and column of a first array, said reference cells are arranged rows of columns of a second array different from said first array.

22. The memory system of claim 1, wherein said comparison circuit includes one or more comparators.

23. The memory system of claim 22, wherein each of said comparators is a sense amplifiers.

24. A memory system, comprising:
   one or more memory cells, each of said memory cells including a programmable resistor programmable to at least a first resistance state and a second resistance state;
   one or more reference cells, each of said reference cells including a programmable resistor programmable to at least said first resistance state and said second resistance state; and
   a comparison circuit in communication with said memory cells and with said reference cells, said comparison circuit adapted to compare a sense signal developed by one of said memory cells with a reference signal developed by at least one of said reference cells and to provide an output signal in response to said comparison.

25. The memory system of claim 24, wherein said sense signal is developed by directing at least one sense current through the programmable resistor of at least one of said memory cells, said reference signal is developed by directing at least one reference current through the programmable resistor of at least one of said reference cells.

26. The memory system of claim 24, wherein said sense signal and said reference signal are voltages.

27. The memory system of claim 24, wherein said one or more reference cells is a plurality of reference cells including one or more first reference cells programmed to said first resistance state and one or more second reference cells programmed to said second resistance state.

28. The memory system of claim 27, wherein said reference signal is developed by at least one of said first reference cells and at least one of said second reference cells.

29. The memory system of claim 27, wherein said reference signal is a combination of a first signal developed by at least one of said first reference cells and a second signal developed by at least one of said second reference cells.

30. The memory system of claim 24, wherein said memory cells and said reference cells are arranged in rows and columns of an array, said array including:
 a plurality of row lines, each of said row lines associated with a corresponding row of said array and coupled to said memory cells and/or said reference cells in said corresponding row; and
 a plurality of column lines, each of said column lines associated with a corresponding column of said array and coupled to said memory cells and/or said reference cells in said corresponding column.

31. The memory system of claim 30, wherein said reference cells include one or more first reference cells programmed to said first resistance state and one or more second reference cells programmed to said second resistance state.

32. The memory system of claim 31, wherein said memory cells is at least one column of memory cells, said first reference cells is at least one column of first reference cells and said second reference cells is at least one column of second reference cells.

33. The memory system of claim 32, wherein the column lines corresponding to said at least one column of first reference cells and the column lines corresponding to said at least one column of second reference cells are coupled together at a reference node.

34. The memory system of claim 24, wherein said comparison circuit includes one or more comparators.

35. The memory system of claim 33, wherein said comparison circuit includes one or more comparators, each of the column lines corresponding to said at least one column of memory cells is coupled to a first input of a corresponding comparator, said reference node being coupled to a second input of each of said comparators.

36. The memory system of claim 34, wherein each of said comparators is a sense amplifier.

37. The memory system of claim 24, wherein said comparison circuit is further adapted to latch said sense signal and said reference signal.

38. The memory system of claim 24, wherein the programmable resistor of said memory cells and said reference cells comprises a phase-change material.

39. The memory system of claim 24, wherein the programmable resistance element of each of said at least one memory cell and each of said at least one reference cell comprises a chalcogen element.

40. The memory system of claim 24, wherein said memory system is adapted to be radiation hard.

41. A memory system, comprising:
 at least a first and a second memory array, each of said arrays comprising:
 one or more memory cells, each of said memory cells including a programmable resistor programmable to at least a first resistance state and a second resistance state;
 one or more reference cells, each of said reference cells including a programmable resistor programmable to at least said first resistance state and said second resistance state; and
 a comparison circuit in communication with said first and second arrays, said comparison circuit adapted to compare at least one sense signal developed by at least one of said memory cells of said first array with at least one reference signal developed by at least one of said reference cells of said second array, said comparison circuit adapted to compare at least one sense signal developed by at least one of said memory cells of said second array with at least one reference signal developed by at least one of said reference cells of said first array, said comparison circuit adapted to provide at least one output signal in response to said comparisons.

42. The memory system of claim 41, wherein each of said at least one sense signal of each of said arrays is developed by directing at least one current through the programmable resistor element of at least one of said memory cells of the corresponding array.

43. The memory system of claim 41, wherein each of said at least one reference signal of each of said arrays is developed by directing at least one current through the programmable resistor of at least one of said reference cells of the corresponding array.

44. The memory system of claim 41, wherein said at least one sense signal and said at least one reference signal of each of said arrays are voltages.

45. The memory system of claim 41, wherein said at least one sense signal of each of said arrays includes a sense signal developed by one of said memory cells of the corresponding array.

46. The memory system of claim 41, wherein said one or more reference cells of each said arrays is a plurality of reference cells including one or more first reference cells programmed to said first resistance state and one or more second reference cells programmed to said second resistance state.

47. The memory system of claim 46, wherein said at least one reference signal of each of said arrays includes a reference signal developed by at least one of said first reference cells and at least one of said second reference cells of the corresponding array.

48. The memory system of claim 46, wherein said at least one reference signal of each of said arrays includes a reference signal which is a combination of at least one first signal developed by at least one of said first reference cells of the corresponding array and at least one second signal developed by at least one of said second reference cells of the corresponding array.

49. The memory system of claim 46, wherein said at least one reference signal of each of said arrays includes a reference signal developed by at least one of said first reference cells of the corresponding array.

50. The memory system of claim 46, wherein said at least one reference signal of each of said arrays includes a reference signal developed by at least one of said second reference cells of the corresponding array.

51. The memory system of claim 46, wherein said at least one reference signal of each of said arrays includes a first reference signal developed by at least one of said first reference cells and a second reference signal developed by at least one of said second reference cells of the corresponding array.

52. The memory system of claim 46, wherein said at least one sense signal of each of said arrays is a sense signal developed by one of said memory cells of the corresponding array, said at least one reference signal of each of said arrays is a reference signal developed by at least one of said first reference cells and at least one of said second reference cells of the corresponding array, said comparison circuit is adapted to compare the sense signal of one of said arrays with the reference signal of the other of said arrays and provide an output signal is response to said comparison.

53. The memory system of claim 41, wherein each of said memory arrays further comprises:
   a plurality of row lines and a plurality of column lines associated with corresponding rows and columns of said arrays, said rows lines coupled to memory cells and/or reference cells in respective rows of the corresponding array, said column lines coupled to memory cells and/or reference cells in respective columns of the corresponding array.

54. The memory system of claim 53, wherein said reference cells of each of said arrays includes a row of reference cells.

55. The memory system of claim 54, wherein said row of reference cells of each of said arrays includes at least one first reference cell programmed to said first resistance state and at least one second reference cell programmed to said second resistance state.

56. The memory system of claim 54, wherein said row of reference cells of each of said arrays comprises one or more pairs of reference cells where each of said pairs includes a first reference cell programmed to said first resistance state and a second reference cell programmed to said second resistance state.

57. The memory system of claim 56, wherein said at least one reference signal of each of said arrays includes a reference signal developed by one of said pairs of reference cells.

58. The memory system of claim 56, wherein the column line corresponding to the first reference cell is selectively coupled to the column line corresponding to the second reference cell for each of said pairs of reference cells of each of said arrays.

59. The memory system of claim 53, wherein said comparison circuit comprises one or more comparators, each of said comparators having a first input and a second input, each of said comparators adapted to compare a first input signal received on said first input with a second input signal received on said second input.

60. The memory system of claim 59, wherein each of said column lines of said first array is coupled to the first input of a corresponding comparator, and further wherein each of said column lines of said second array is coupled to the second input of a corresponding comparator.

61. The memory system of claim 59, wherein each of said comparators is a sense amplifier.

62. The memory system of claim 58, wherein said corresponding column lines are selectively coupled through the current path of transistors.

63. The memory system of claim 41, wherein said memory cells and said resistance cells of each of said arrays are programmable to at least three resistance states.

64. The memory system of claim 63, wherein said one or more reference cells of each of said arrays is three or more reference cells, each of said reference cells programmed to a unique one of said at least three resistance states.

65. The memory system of claim 41, wherein said programmable resistor comprises a phase-change material.

66. The memory system of claim 41, wherein said programmable resistor comprises at least one chalcogen element.

67. The memory system of claim 41, wherein said comparison circuit is further adapted to latch said sense signals and said reference signals of said first and second arrays.

68. The memory system of claim 41, wherein said memory system is adapted to be radiation hard.

69. A memory system, comprising:
   a memory cell including a first programmable resistor programmable to at least a first resistance state and a second resistance state;
   a second programmable resistor programmable to at least said first resistance state and said second resistance state, said second resistor programmed to said first resistance state;
   third programmable resistor programmable to at least said first resistance state and said second resistance state, said third resistor programmed to said second resistance state; and
   a comparator adapted to compare a sense signal developed by said first programmable resistor with a reference signal developed by said second programmable resistor and/or said third programmable resistor.

70. The memory system of claim 69, wherein said sense signal is developed by directing a current through said first programmable resistor, said reference signal is developed by directing currents through said second and/or said third programmable resistors.

71. The memory system of claim 69, wherein said reference signal is developed by said second programmable resistor and said third programmable resistor.

72. The memory system of claim 69, wherein said sense signal and said reference signal are voltages.

73. The memory system of claim 69, wherein each of said programmable resistors comprise a phase-change material.

74. The memory system of claim 69, wherein each of said programmable resistors comprise at least one chalcogen element.

75. The memory system of claim 69, wherein each of said programmable resistors are radiation hard.

76. A method of reading a memory cell, said memory cell including a programmable resistor programmable to at least a first resistance state and a second resistance state, said method comprising the steps of:
   providing one or more reference cells, each of said reference cells including a programmable resistor programmable to at least said first resistance state and said second resistance state;
   developing a sense signal by directing a current through the programmable resistor of said memory cell;
   developing at least one reference signal by directing at least one current through the programmable resistor of at least one of said reference cells;
   comparing said sense signal with said at least one reference signal; and
   providing an output signal in response to said comparing step.

77. The method of claim 76, wherein said output signal is indicative of the resistance state of said memory cell.

78. The method of claim 76, wherein said sense signal and said at least one reference signal are voltages.

79. The method of claim 76, wherein said developing a sense signal step is performed without exceeding the threshold voltage of the programmable resistor of said memory cell.

80. The method of claim 76, wherein said developing a reference signal step is performed without exceeding the threshold voltages of the programmable resistors of said reference cells.

81. The method of claim 76, wherein said comparing step comprises the step of:

latching said sense signal and said at least one reference signal.

82. The method of claim 76, wherein said one or more reference cells comprises one or more first reference cells programmed to said first resistance state and one or more second reference cells programmed to said second resistance state.

83. The method of claim 82, wherein said at least one reference signal comprises a reference signal developed by at least one of said first reference cells and at least one of said second reference cells.

84. The method of claim 82, wherein said at least one reference signal comprises a first reference signal developed by at least one of said first reference cells and a second reference signal developed by at least one of said second reference cells.

85. The method of claim 76, wherein said programmable resistors of said memory cell and said at least one reference cell comprise a phase-change material.

86. The method of claim 76, wherein said programmable resistors of said memory cell and said at last one reference cell comprises a chalcogen element.

87. A method of reading a memory cell, said memory cell comprising a programmable resistor programmable to at least a first resistance state and a second resistance state, said memory cell interconnecting a row line and a column line, said method comprising the steps of:

directing said column line to a first voltage level;

directing said row line to a second voltage level sufficient to cause a current to flow through said programmable resistor, said current directing said column line to a third voltage level; and comparing said third voltage level to a reference voltage, said reference voltage developed by directing at least one current through one or more reference cells, each of said reference cells comprising a programmable resistor programmable to at least said first resistance state and said second resistance state.

88. The method of claim 87, wherein said first voltage is such that the voltage drop across said programmable resistor is less than the threshold voltage thereof.

89. The method of claim 87, further comprising the step of:

after said comparing step, providing an output signal in response to said comparing step.

90. The method of claim 87, wherein said reference cells comprises one or more first reference cells programmed to said first resistance state and one or more second reference cells programmed to said second resistance state.

91. A memory system comprising:

a memory cell, said memory cell including a programmable resistor programmable to at least a first resistance state and a second resistance state;

one or more reference cells, each of said reference cell programmable to at least said first resistance state and said second resistance state; and a comparison circuit in communication with said memory cell and said reference cells, said comparison circuit adapted to compare a sense signal developed by said memory cell with at least one reference signal developed by said reference cells and provide an output signal in response to said comparisons.

92. The memory system of claim 91, wherein said sense signal is developed by directing a sense current through the programmable resistor of said memory cell, said reference signals being developed by directing reference currents through the programmable resistors of said reference cells.

93. The memory system of claim 91, wherein said reference cells include a first reference cell programmed to said first resistance state and a second reference cell programmed to said second resistance state.

94. The memory system of claim 93, wherein said at least one reference signal includes a reference signal developed by said first reference cell and said second reference cell.

95. The memory system of claim 94, wherein said at least one reference signal includes a first reference signal developed by said first reference cell and a second reference signal developed by said second reference cell.

96. The memory system of claim 93, further comprising a first column line coupled to said first reference cell and a second column line coupled to said second reference cell, said first column line selectively coupled to said second column line.

97. The memory system of claim 91, wherein said comparison circuit is further adapted to latch said sense signal and said reference signal.

98. The memory system of claim 91, wherein said comparison circuit comprises a comparator.

99. The memory system of claim 91, wherein said comparison circuit comprises a sense amplifier.

* * * * *